(12) United States Patent
Kanazawa et al.

(10) Patent No.: US 12,369,322 B2
(45) Date of Patent: Jul. 22, 2025

(54) SEMICONDUCTOR DEVICE AND MANUFACTURING METHOD THEREOF

(71) Applicant: KIOXIA CORPORATION, Tokyo (JP)

(72) Inventors: Rikito Kanazawa, Yokkaichi Mie (JP); Masaki Tsuji, Yokkaichi Mie (JP); Kojiro Shimizu, Mie Mie (JP)

(73) Assignee: Kioxia Corporation, Tokyo (JP)

( * ) Notice: Subject to any disclaimer, the term of this patent is extended or adjusted under 35 U.S.C. 154(b) by 513 days.

(21) Appl. No.: 17/901,802

(22) Filed: Sep. 1, 2022

(65) Prior Publication Data
US 2023/0276629 A1 Aug. 31, 2023

(30) Foreign Application Priority Data
Feb. 28, 2022 (JP) .................. 2022-030205

(51) Int. Cl.
*H10B 43/35* (2023.01)
*H10B 41/10* (2023.01)
*H10B 41/27* (2023.01)
*H10B 41/35* (2023.01)
*H10B 43/10* (2023.01)
*H10B 43/27* (2023.01)

(52) U.S. Cl.
CPC .............. *H10B 43/35* (2023.02); *H10B 41/10* (2023.02); *H10B 41/27* (2023.02); *H10B 41/35* (2023.02); *H10B 43/10* (2023.02); *H10B 43/27* (2023.02)

(58) Field of Classification Search
CPC ........ H10B 41/27; H10B 43/27; H10B 41/35; H10B 43/35; H10B 43/10; H10B 41/10
See application file for complete search history.

(56) References Cited

U.S. PATENT DOCUMENTS

| | | | |
|---|---|---|---|
| 2012/0061743 A1 | 3/2012 | Watanabe et al. | |
| 2016/0365352 A1 | 12/2016 | Nishikawa et al. | |
| 2018/0197876 A1 | 7/2018 | Chun et al. | |
| 2022/0085062 A1 | 3/2022 | Unno et al. | |
| 2023/0106571 A1* | 4/2023 | Shen ....................... | G11C 8/14 257/314 |

FOREIGN PATENT DOCUMENTS

| | | |
|---|---|---|
| JP | 2012-059966 A | 3/2012 |
| TW | 202133344 A | 9/2021 |

* cited by examiner

*Primary Examiner* — Jaehwan Oh
(74) *Attorney, Agent, or Firm* — Kim & Stewart LLP

(57) ABSTRACT

A semiconductor device includes a body including conductive layers stacked and spaced from each other in a first direction and first and second areas along a second direction intersecting the first direction, an insulating portion extending along the directions in the areas and dividing the conductive layers in a third direction intersecting the directions, first columnar portions extending along the first direction in the first area and including a semiconductor layer, memory cells being formed at intersections between the conductive and semiconductor layers, second columnar portions extending along the first direction in the second area and including an insulator, third columnar portions extending along the first direction in the second area and including a semiconductor layer, and contacts extending along the first direction in the second area and connected to a conductive layer. The second portions are arranged along the insulating portion on both sides thereof in the third direction.

20 Claims, 18 Drawing Sheets

SEMICONDUCTOR DEVICE AND MANUFACTURING METHOD THEREOF

CROSS-REFERENCE TO RELATED APPLICATION

This application is based upon and claims the benefit of priority from Japanese Patent Application No. 2022-030205, filed Feb. 28, 2022, the entire contents of which are incorporated herein by reference.

FIELD

Embodiments described herein relate generally to a semiconductor device and a manufacturing method thereof.

BACKGROUND

A semiconductor storage device such as a NAND-type flash memory may include a three-dimensional memory cell array in which a plurality of memory cells are three-dimensionally arranged. In forming such a three-dimensional memory cell array, there is a step of replacing the sacrificial films included in a stacked body of insulating films and sacrificial films with metal films (e.g., to be used as word lines and the like). This step can be referred to as a replacement step or process. By the replacement step, a stacked body including metal films and insulating films is formed.

A support column formed of silicon oxide is often provided in an area without memory cells so that the insulating films remaining after the removal the sacrificial film in such a replacement step does not sink or sag before the metal films are formed or the like. However, due to a heat shrinkage difference (e.g., due to a difference in thermal expansion coefficients) between the support column and a columnar portion for the memory cell, a portion of the stacked body still sinks in some cases. The sinkage of the portion of the stacked body causes a defective embedding (filling) of the metal film (e.g., the word line) or causes a material for forming the metal film to remain on the stacked body in an unwanted area or the like.

DETAILED DESCRIPTION

Figure 1:
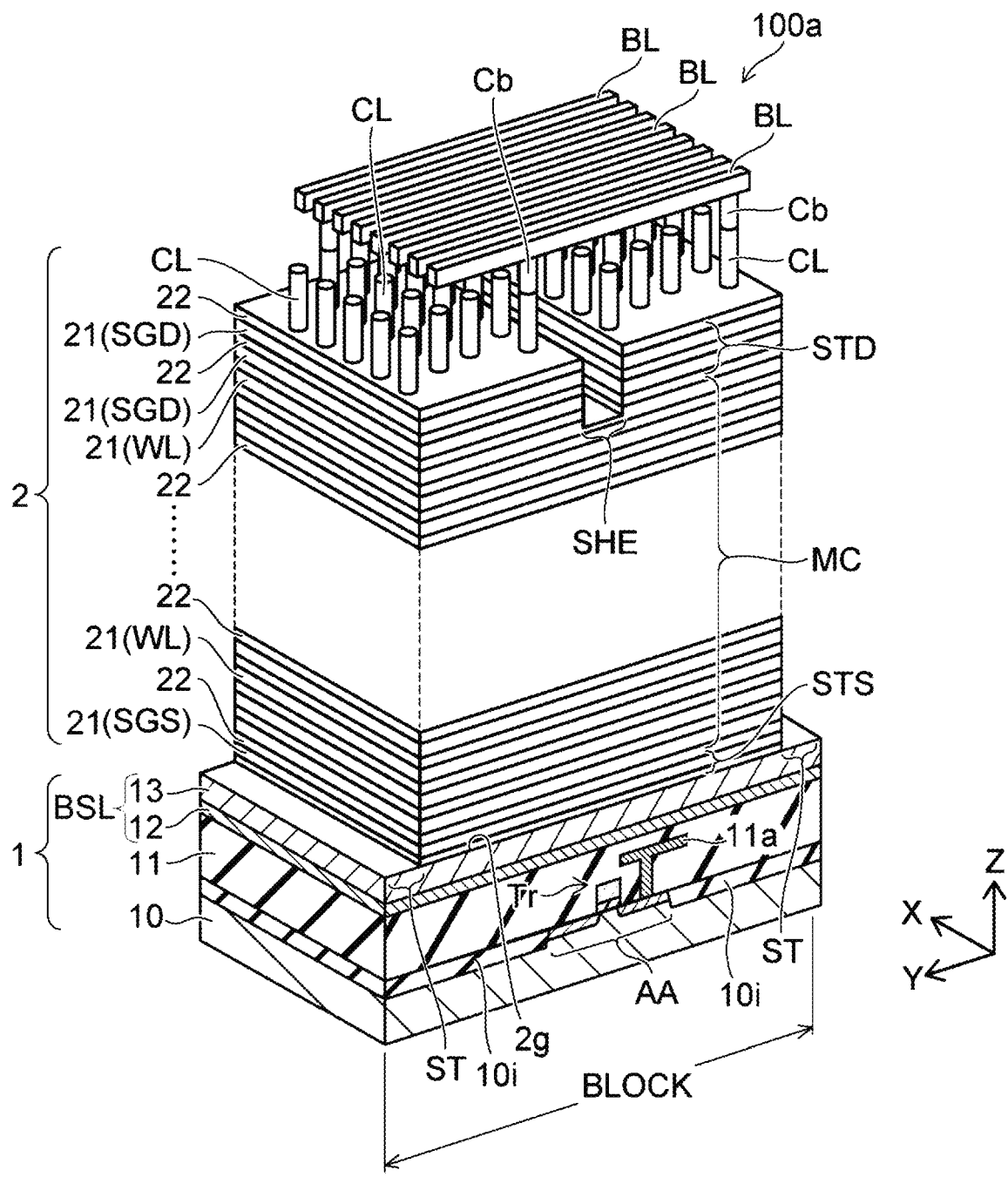
FIG. 1 is a perspective view schematically illustrating a semiconductor device according to a first embodiment.

Embodiments provide a semiconductor device designed to limit sinkage in the manufacturing process of a memory cell array and a manufacturing method corresponding thereto.

In general, according to one embodiment, a semiconductor device includes a stacked body including a plurality of conductive layers that are stacked and spaced from each other in a first direction, the stacked body further including first and second areas arranged along a second direction intersecting the first direction. The semiconductor device further includes an insulating portion extending along the first and second directions in the first and second areas and dividing the conductive layers in a third direction intersecting the first and second directions. The semiconductor device further includes a plurality of first columnar portions each extending along the first direction in the first area and including a first semiconductor layer. A plurality of memory cells are formed at intersections between the conductive layers and the first semiconductor layer. The semiconductor device further includes a plurality of second columnar portions each extending along the first direction in the second area and including an insulator. The semiconductor device further includes a plurality of third columnar portions each extending along the first direction in the second area and including a second semiconductor layer. The semiconductor device further includes a plurality of contacts each extending along the first direction in the second area and electrically connected to one of the conductive layers. The second columnar portions are arranged along the insulating portion on both sides thereof in the third direction.

Certain example embodiments are described with reference to the drawings. Those embodiments are not intended to limit the scope of the present disclosure. In the following examples, a depicted vertical direction may be different from a vertical direction according to gravitational acceleration. The drawings are schematic or conceptual, and the dimensions, relative scales, and ratio of dimensions of each part or the like is not necessarily the same as an actual one. In the specification and the drawings, the same elements are denoted by the same reference numerals in the drawings, and the description thereof is repeated as appropriate.

First Embodiment

Figure 2:
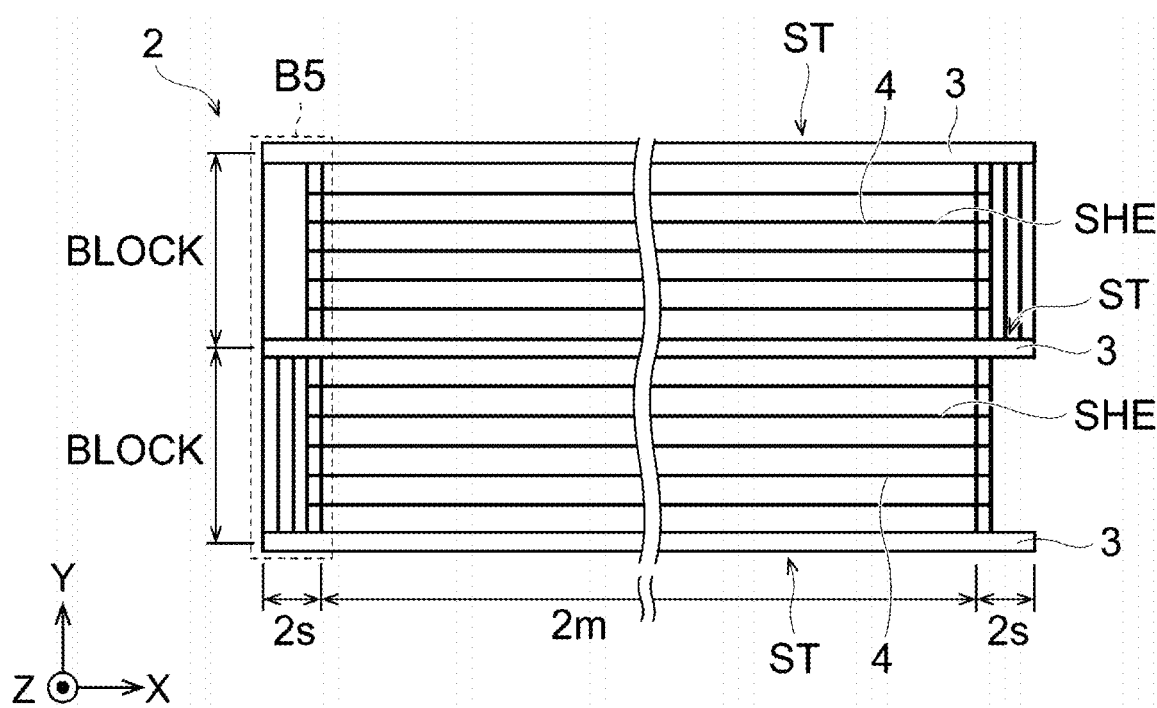
FIG. 2 is a plan view schematically illustrating a stacked body of a semiconductor device.
Figure 3:
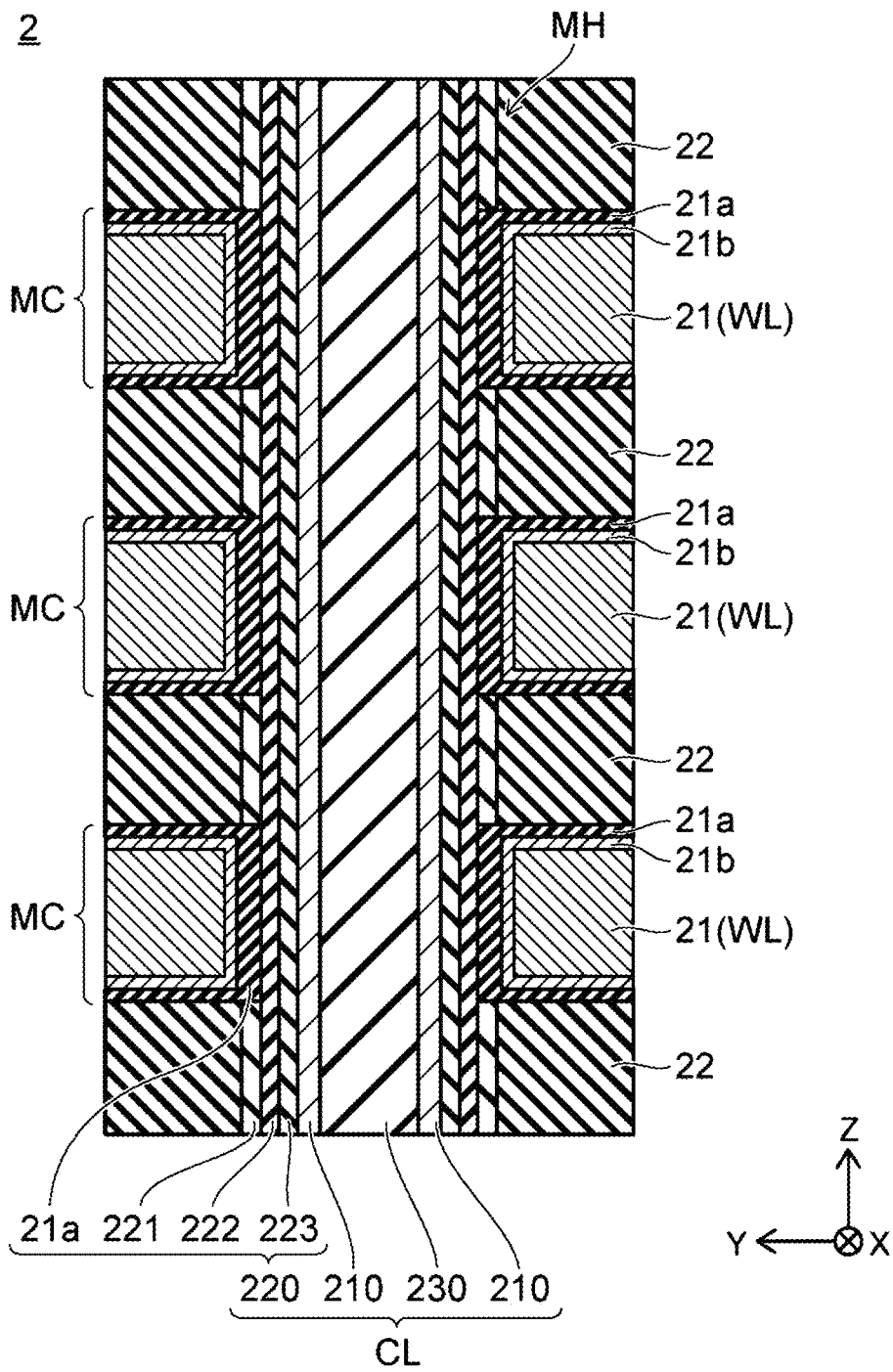
FIGS. 3 and 4 are cross-sectional views schematically illustrating memory cells with a three-dimensional structure.
Figure 4:
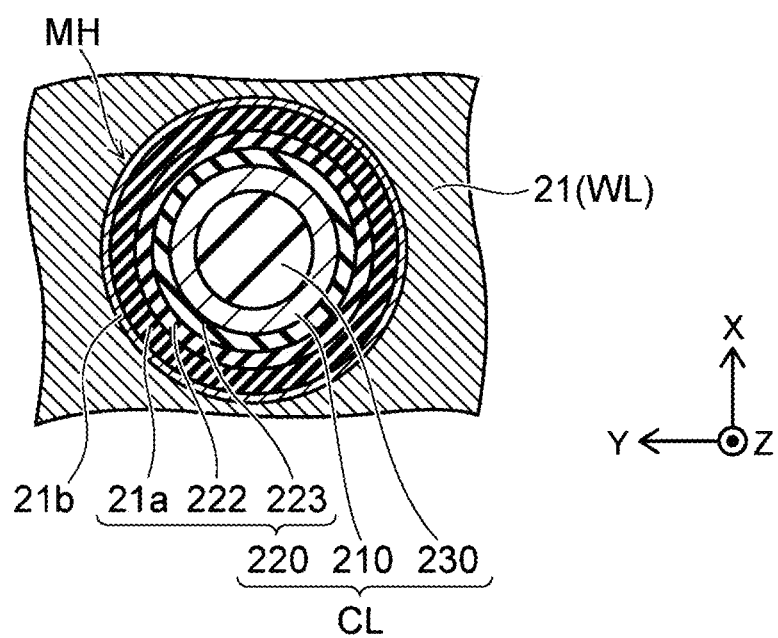

FIG. 1 is a perspective view schematically illustrating a semiconductor storage device 100a according to a first embodiment. FIG. 2 is a plan view schematically illustrating a stacked body 2 in FIG. 1. In the present description, a stacking direction of the stacked body 2 is defined as a Z direction. One direction that intersects with (for example, orthogonal to) the Z direction is defined as a Y direction. One direction that intersects with (for example, orthogonal to) each of the Z and Y directions is defined as an X direction. FIGS. 3 and 4 are cross-sectional views schematically illustrating memory cells with a three-dimensional structure.

As illustrated in FIGS. 1 to 4, the semiconductor storage device 100a according to the first embodiment is a nonvolatile memory including memory cells with a three-dimensional structure.

The semiconductor storage device 100a includes a base body portion 1, the stacked body 2, deep slits ST (also referred to as plate-shaped portions 3), a shallow slit SHE (also referred to as a plate-shaped portion 4), and a plurality of columnar portions CL.

The base body portion 1 includes a substrate 10, an interlayer insulating film 11, a conductive layer 12, and a semiconductor portion 13. The interlayer insulating film 11 is provided on the substrate 10. The conductive layer 12 is provided on the interlayer insulating film 11. The semiconductor portion 13 is provided on the conductive layer 12.

The substrate 10 is a semiconductor substrate, for example, a silicon substrate. A conductivity type of silicon (Si) is, for example, p type. For example, element isolation areas 10*i* are provided in a front surface area of the substrate 10. The element isolation area 10*i* is, for example, an insulating area including silicon oxide ($SiO_2$) and partitions an active area AA in the front surface area of the substrate 10. Source and drain areas of a transistor Tr are provided in the active area AA. The transistor Tr forms a peripheral circuit (e.g., a complementary metal oxide semiconductor (CMOS) circuit) of the nonvolatile memory. The CMOS circuit is provided below a buried source layer BSL and provided on the substrate 10. The interlayer insulating film 11 includes, for example, silicon oxide and insulates the transistor Tr. Wiring 11*a* is provided in the interlayer insulating film 11. A portion of the wiring 11*a* is electrically connected to the transistor Tr. The conductive layer 12 includes a conductive metal, for example, tungsten (W). The semiconductor portion 13 includes, for example, silicon. The conductivity type of silicon is, for example, n type. The semiconductor portion 13 includes a plurality of layers, and a portion thereof may include undoped silicon. In one embodiment, one of the conductive layer 12 and the semiconductor portion 13 may be omitted.

The conductive layer 12 and the semiconductor portion 13 function as a common source line for the memory cell array (see 2*m* of FIG. 2). The conductive layer 12 and the semiconductor portion 13 are electrically connected as an integral conductive film and collectively referred to as the buried source layer BSL.

The stacked body 2 is provided above the substrate 10 and positioned in the Z direction with respect to the buried source layer BSL. The stacked body 2 is formed by alternately stacking a plurality of electrode films 21 (also referred to as conductive layers 21) and a plurality of insulating films 22 along the Z direction. The electrode film 21 includes a conductive metal, for example, tungsten. The insulating film 22 includes, for example, silicon oxide. The insulating film 22 insulates the electrode films 21 from each other. Accordingly, the electrode films 21 are stacked in the Z direction (also referred to as a first direction in some contexts) and electrically isolated from each other. The number of layers of each of the electrode films 21 and the insulating films 22 is freely selected. An air gap may be formed instead of or as the insulating film 22. An insulating film 2*g* is provided, for example, between the stacked body 2 and the semiconductor portion 13. The insulating film 2*g* comprises, for example, silicon oxide. The insulating film 2*g* may include a high dielectric material having a relative permittivity (dielectric constant) greater than silicon oxide. The high dielectric material may be, for example, metal oxide.

The electrode films 21 include at least one source-side select gate SGS, a plurality of word lines WL, and at least one drain-side select gate SGD. The source-side select gate SGS is a gate electrode of a source-side select transistor STS. The word line WL is a gate electrode of a memory cell MC. The drain-side select gate SGD is a gate electrode of a drain-side select transistor STD. The source-side select gate SGS is provided in a lower area of the stacked body 2. The drain-side select gate SGD is provided in an upper area of the stacked body 2. The lower area refers to an area of the stacked body 2 that is close to the base body portion 1, and the upper area refers to an area of the stacked body 2 that is far from the base body portion 1. The word line WL is provided between the source-side select gate SGS and the drain-side select gate SGD.

Among the plurality of insulating films 22, a thickness of the insulating film 22 that insulates the source-side select gate SGS from the adjacent word line WL in the Z direction may be, for example, thicker than a thickness of the insulating film 22 that insulates a word line WL from another word line WL in the Z direction. Furthermore, a cover insulating film may be provided on the uppermost insulating film 22 farthest from the base body portion 1. The cover insulating film comprises, for example, silicon oxide.

The semiconductor storage device 100*a* includes a plurality of memory cells MC connected to each other in series between the source-side select transistor STS and the drain-side select transistor STD. A structure in which the source-side select transistor STS, the memory cells MC, and the drain-side select transistor STD are connected in series is referred to as a "memory string" or a "NAND string". The memory string is connected to a bit line BL via, for example, a contact Cb. Bit lines BL are provided above the stacked body 2 and extend in the Y direction.

The plurality of deep slits ST and the plurality of shallow slits SHE are provided in the stacked body 2. The deep slit ST extends in the X direction in a plan view seen from the Z direction. The deep slit ST divides the stacked body 2 in the Y direction. In addition, the deep slit ST is provided in the stacked body 2 and penetrates the stacked body 2 in the Z direction from an upper end of the stacked body 2 to the base body portion 1. The plate-shaped portion 3 is wiring provided in the deep slit ST (see FIG. 2). The plate-shaped portion 3 includes a conductive film that is electrically insulated from the stacked body 2 by an insulating film provided on an inner wall of the deep slit ST and is electrically connected to the buried source layer BSL buried in the deep slit ST. The plate-shaped portion 3 may be filled with an insulating material such as a silicon oxide film. The deep slit ST extends in the Z direction and divides and electrically isolates the plurality of electrode films 21 in the stacked body 2.

The shallow slit SHE extends in the X direction in a plan view seen from the Z direction. In a vertical cross section, the shallow slit SHE extends in the Z direction in the stacked body 2 from the upper end of the stacked body 2 to the middle of the stacked body 2. The shallow slit SHE penetrates one or the plurality of electrode films 21 in the upper area of the stacked body 2 in which the drain-side select gates SGD are provided and electrically isolates the electrode films 21. For example, the plate-shaped portion 4 is provided in the shallow slit SHE (see FIG. 2). The plate-shaped portion 4 is formed of, for example, silicon oxide.

As illustrated in FIG. 2, the stacked body 2 includes step portions 2*s* and a memory cell array 2*m*. The step portions 2*s* are provided in the edge portions of the stacked body 2. The memory cell array 2*m* is interposed or surrounded by the step portion 2*s*. The deep slit ST is provided from the step portion 2*s* at one end of the stacked body 2 to the step portion 2*s* at the other end of the stacked body 2 via the memory cell array 2*m*. A shallow slit SHE is provided at least in the memory cell array 2*m*. A plurality of shallow slits SHE are provided between the adjacent deep slits ST in a plan view seen from the Z direction and extend substantially parallel to the deep slits ST in the X direction.

The deep slits ST and the shallow slits SHE extend substantially parallel to each other in a plan view seen from the Z direction. A portion of the stacked body 2 interposed between the two slits ST illustrated in FIG. 2 is referred to as a block. The block corresponds to, for example, a minimum unit for erasing data. The shallow slits SHE are provided in the block between the slits ST. The stacked body 2 between the shallow slits SHE or the stacked body 2 between the deep slit ST and the shallow slit SHE is referred to as a finger. The drain-side select gates SGD are separated per finger. Therefore, at the time of writing and reading data, one finger in the block can enter a selection state by the drain-side select gate SGD.

As illustrated in FIG. 3, the columnar portions CL are provided in memory holes MH formed in the stacked body 2. Each columnar portion CL extends in the stacked body 2 in Z direction, penetrates the stacked body 2 from the upper end of the stacked body 2, and is provided toward an inside of the stacked body 2 and an inside of the buried source layer BSL. Each of the columnar portions CL includes a semiconductor body 210, a memory film 220, and a core layer 230. The columnar portion CL includes the core layer 230 provided in a central portion thereof, the semiconductor body 210 provided around the core layer 230, and the memory film 220 provided around the semiconductor body 210. The semiconductor body 210 is a semiconductor portion extended in the stacked body 2 in the Z direction and includes, for example, a silicon single crystal, polysilicon, or amorphous silicon. The semiconductor body 210 is electrically connected to the buried source layer BSL. The memory film 220 as a charge storage member includes a charge storage portion between the semiconductor body 210 and the electrode films 21. The plurality of columnar portions CL selected one by one from each finger are commonly connected to one bit line BL via the contact Cb. The columnar portions CL are provided, for example, in a cell area.

As illustrated in FIG. 4, a shape of the memory hole MH in an X-Y plane is, for example, a circle or an ellipse. A block insulating film 21a that is a portion of the memory film 220 may be provided between the electrode film 21 and the insulating film 22. The block insulating film 21a is, for example, a silicon oxide film or a metal oxide film. One example of the metal oxide is aluminum oxide. A barrier film 21b may be provided between the electrode film 21 and the insulating film 22 and between the electrode film 21 and the memory film 220. For example, when the electrode film 21 is tungsten, titanium nitride is selected as the barrier film 21b. The block insulating film 21a prevents back tunneling of charges from the electrode film 21 to the memory film 220 side. The barrier film 21b improves adhesion between the electrode film 21 and the block insulating film 21a.

A shape of the semiconductor body 210 as the semiconductor column is, for example, a cylindrical shape having a bottom. The semiconductor body 210 includes, for example, silicon. The silicon is, for example, polysilicon obtained by crystallizing amorphous silicon. The semiconductor body 210 is, for example, undoped silicon. In addition, the semiconductor body 210 may be p-type silicon. The semiconductor body 210 becomes a channel of each of the drain-side select transistor STD, the memory cell MC, and the source-side select transistor STS.

In the memory film 220, the rest portions of the block insulating films 21a are provided between an inner wall of the memory hole MH and the semiconductor body 210. A shape of the memory film 220 is, for example, a cylindrical shape. The memory cells MC include storage areas between the semiconductor body 210 and the electrode films 21 to be the word lines WL and are stacked in the Z direction. The memory film 220 includes, for example, a cover insulating film 221, a charge storage film 222, and a tunnel insulating film 223. The semiconductor body 210, the charge storage film 222, and the tunnel insulating film 223 each extend in the Z direction.

The cover insulating film 221 is provided between the insulating films 22 and the charge storage film 222. The cover insulating film 221 includes, for example, silicon oxide. The cover insulating film 221 protects the charge storage film 222 that is not to be etched when the sacrificial films are replaced with the electrode films 21 (during the replacement step). In the replacement step, the cover insulating film 221 may be removed from a portion between the electrode films 21 and the memory film 220. In such a case, as illustrated in FIGS. 3 and 4, for example, the block insulating films 21a are provided between the electrode films 21 and the charge storage film 222. On the other hand, when the replacement step is not used for forming the electrode films 21, the cover insulating film 221 may not need to be provided.

The charge storage film 222 is provided between each of the block insulating film 21a and the cover insulating film 221 and the tunnel insulating film 223. The charge storage film 222 comprises, for example, silicon nitride, and has a trap site that traps charges in the film. Portions of the charge storage film 222 that are interposed between the electrode films 21 to be the word lines WL and the semiconductor body 210 are storage areas of the memory cells MC as the charge storage portions. A threshold voltage of each memory cell MC changes depending on presence or absence of charges in the charge storage portion or an amount of charges captured in the charge storage portion, which allows the memory cell MC to store information.

The tunnel insulating film 223 is provided between the semiconductor body 210 and the charge storage film 222. The tunnel insulating film 223 includes, for example, silicon oxide, or silicon oxide and silicon nitride. The tunnel insulating film 223 is a potential barrier between the semiconductor body 210 and the charge storage film 222. For example, when electrons are injected from the semiconductor body 210 to a charge storage portion (e.g., in a write operation), and when holes are injected from the semiconductor body 210 to a charge storage portion (e.g., in an erasing operation), the electrons and holes each pass through the potential barrier of the tunnel insulating film 223 (referred to as tunneling).

The core layer 230 is embedded in an internal space of the semiconductor body 210 having a cylindrical shape. The shape of the core layer 230 is, for example, a columnar shape. The core layer 230 includes, for example, silicon oxide, and has insulating properties.

As illustrated in FIG. 3, the memory cells MC are provided in accordance with intersections between the plurality of electrode films 21 (WL) and the columnar portions CL.

Figure 5:
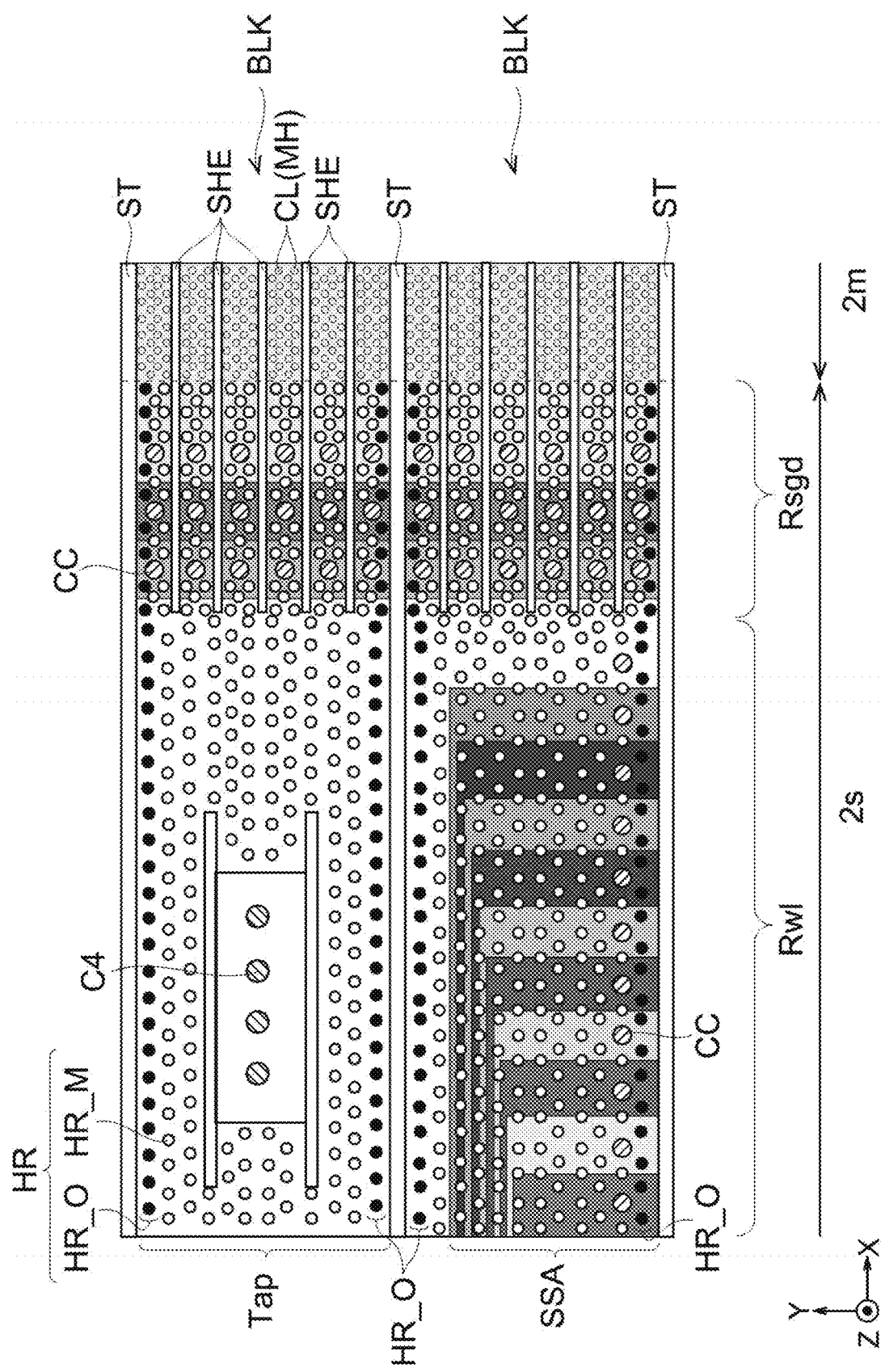
FIG. 5 is a plan view showing a boundary portion between a memory cell array and a step portion.

FIG. 5 is a plan view of a boundary portion between the memory cell array 2m and the step portion 2s. In the memory cell array 2m, a plurality of columnar portions CL are provided in the corresponding memory holes MH. Further, though scales are different, FIG. 5 shows a planar layout of a broken line frame B5 of FIG. 2.

Each of the columnar portions CL is provided in a memory hole MH provided in the stacked body 2. The memory hole MH penetrates the stacked body 2 from the upper end of the stacked body 2 along the stacking direction of the stacked body 2 (Z-axis direction), and extends toward the inside of the stacked body 2 and an inside of the semiconductor portion 13. As illustrated in FIGS. 3 and 4, each columnar portion CL includes, for example, the semiconductor body 210 as the semiconductor column, the memory film 220, and the core layer 230. The semiconductor body 210 extends in the stacking direction in the stacked body 2 (Z direction) and is electrically connected to the semiconductor portion 13. The memory film 220 includes the charge storage portion between the semiconductor body 210 and the electrode films 21. The columnar portions CL selected one by one from each finger are commonly connected to one bit line BL via the contact Cb of FIG. 1. The columnar portions CL are provided in the memory cell array 2m.

In the step portion 2s other than the memory cell array 2m, a tap area Tap and a step area SSA are provided. The tap area Tap is provided in a block BLK adjacent to the step area SSA in the Y direction across the deep slit ST. The tap area Tap may be provided between cell areas in the X direction. The step area SSA may be also provided between the cell areas in the X direction. The step area SSA is an area in which a plurality of contact plugs CC are provided. The step area SSA may include bridge areas that electrically connect the word lines WL of a plurality of blocks BLK that are adjacent to each other in the X direction across the step area SSA. The tap area Tap is an area where contact plugs C4 are provided. The contact plugs CC and C4 each extend, for example, in the Z direction. The contact plugs CC each extend in the Z direction and are electrically connected, for example, to the electrode films 21 (e.g., the word lines WL). The contact plug CC is provided in one of the electrode films 21. The contact plug C4 is, for example, electrically connected to the wiring 11a in order for power supply or the like to the transistor Tr. For example, a low resistance metal such as copper or tungsten is used for the contact plugs CC and C4. The shallow slit SHE extends in the X direction in the memory cell array 2m and electrically isolates the drain-side select gate SGD per finger.

Further, a select gate area Rsgd is a step area (terrace area) for forming a contact plug connected to the drain-side select gate SGD. A word line area Rwl is a step area (terrace area) for forming a contact plug connected to the word line WL.

A plurality of columnar portions HR are provided around the contact plugs CC. Each of the columnar portions HR is provided in a hole provided in the stacked body 2. The columnar portion HR extends in the Z-axis direction, penetrates the stacked body 2 from the upper end of the stacked body 2, and is provided toward the inside of the stacked body 2 and the inside of the semiconductor portion 13. The columnar portion HR is either an insulator column HR_O or a columnar portion HR_M.

The insulator column HR_O is a columnar portion that extends in the Z direction in the stacked body 2 of the step portion 2s, penetrates the stacked body 2 from the upper end of the stacked body 2, and is provided toward the inside of the stacked body 2 and the inside of the semiconductor portion 13.

The insulator columns HR_O are provided in the step portion 2s having the contact plugs CC electrically connected to the electrode films 21 (e.g., the word lines WL), and are located on both sides of the deep slits ST in the Y direction in a plan view seen from the Z direction. In addition, the insulator columns HR_O are located nearer the deep slits ST than the columnar portions HR_M. For example, as illustrated in FIG. 5, the insulator columns HR_O are located in one row closest to each of the sides of the deep slits ST. Therefore, the columnar portions HR_M are spaced from the deep slits ST by the insulator columns HR_O and are located so as not to be in contact with the deep slits ST. For example, an insulating material such as silicon oxide is used for the insulator column HR_O. Accordingly, when the plate-shaped portion 3 in the deep slit ST is made of a conductive film, the insulator column HR_O may be in contact with the deep slit ST. Also in such a case, the insulator column HR_O can prevent an unintended short circuit of the plate-shaped portion 3. In addition, in the replacement step described below, the insulator columns HR_O can function as support columns of the stacked body 2 on both sides of the slit ST. Further, the insulator columns HR_O may be located in a portion of the row closest to each of the sides of the deep slits ST.

The columnar portions HR_M are provided in the step portion 2s including the contact plugs CC electrically connected to the electrode films 21. The columnar portions HR_M are located at positions spaced from the deep slit ST by the arrangement of the insulator columns HR_O in a plan view seen from the Z direction. The columnar portions HR_M are located in a dispersed manner throughout the entire step portion 2s other than the arrangement of the insulator columns HR_O on both sides of the deep slits ST. The columnar portions HR_M are preferably located in the step portion 2s substantially evenly, in a plan view seen from the Z direction. For example, the columnar portions HR_M may be substantially evenly located in the rest of the area between adjacent deep slits ST other than the one row closest to each side of the deep slits ST. Accordingly, in the replacement step described below, the columnar portions HR_M can well function as the support columns of the stacked body 2. In addition, the columnar portion HR_M may have the same configuration as the columnar portion CL. For example, the columnar portion HR_M may include the cover insulating film 221, the charge storage film 222, the tunnel insulating film 223, and the semiconductor body 210 and the core layer 230 as the second semiconductor column as illustrated in FIGS. 3 and 4. In an example, a metal film such as tungsten or the like is used for the electrode film 21, an aluminum oxide film is used for the cover insulating film 221, a silicon nitride film is used for the charge storage film 222, a silicon oxide film is used for the tunnel insulating film 223, silicon is used for the semiconductor body 210, and a silicon oxide film is used for the core layer 230. In such a case, all of the columnar portions HR_M and CL have a metal-$Al_2O_3$—SiN—$SiO_2$-silicon (MANOS) structure. In other examples, all of the columnar portions HR_M and CL may have a metal-$SiO_2$—SiN—$SiO_2$-silicon (MONOS) structure. Accordingly, a thermal expansion coefficient or a heat shrinkage rate of the columnar portion HR_M becomes substantially the same as that of the columnar portion CL. As a result, the sinkage of the stacked body 2 at the step portion 2s relative to the stacked body 2 at the memory cell array 2m can be prevented. In addition, the columnar portions HR_M can be simultaneously formed through the same step as the columnar portions CL.

According to the present embodiment, the insulator columns HR_O are provided in a row on each o side of the deep slits ST, and the columnar portions HR_M are provided in the step portion 2s at positions other than the rows on each side of the deep slits ST. Accordingly, any difference in thermal expansion coefficients (or a heat shrinkage difference) between the insulator column HR_O and the columnar portion HR_M and CL does not matter, and the sinkage of the step portion 2s can be prevented.

Alternately, within a range where the difference in thermal expansion coefficients (or the heat shrinkage difference) between the insulator columns HR_O and the columnar portions HR_M and CL does not matter, the insulator columns HR_O may be provided in n rows (where n is an integer of 2 or more) on both sides of the deep slits ST. In such a case, a distance between the columnar portions HR_M and the deep slits ST can be increased, and thus the semiconductor body 210 of the columnar portion HR_M can more securely prevent an unintended short circuit of the deep slit ST.

Figure 6:
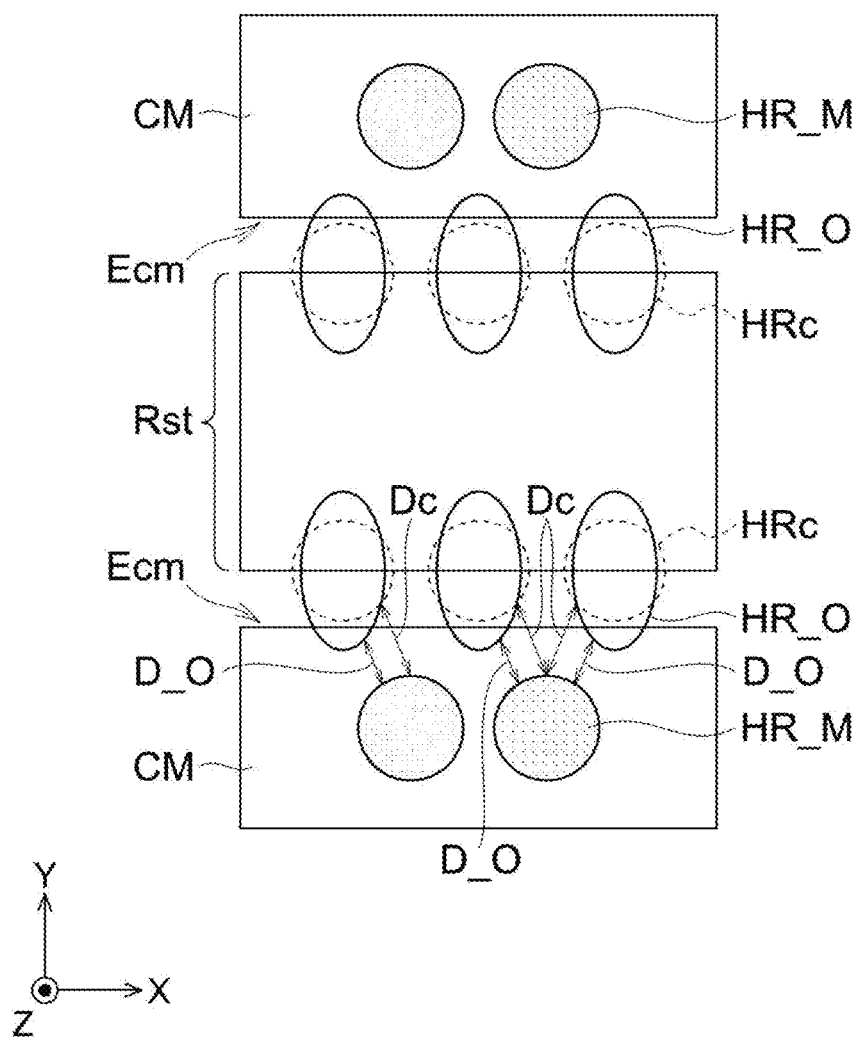
FIG. 6 is a plan view showing a step during formation of an area including columnar portions and insulator columns near slits.

FIG. 6 is a plan view showing a step during formation of an area including columnar portions HR_M and insulator columns HR_O near slits ST. FIG. 6 shows a step of covering the columnar portions HR_M with mask members CM and selectively embedding an insulating material in holes of the insulator columns HR_O after a step of forming the holes of the columnar portions HR_M and the insulator columns HR_O.

According to the present embodiment, the columnar portion HR_M has a substantially circular shape, and the insulator column HR_O has a substantially oval shape in a plan view seen from the Z direction. The insulator column HR_O has a substantially oval shape having a major axis in a direction (Y direction) substantially perpendicular to an extension direction (X direction) of the slit ST. For example, the major axis of the insulator column HR_O (a length in the Y direction) may be about 1.2 times a minor axis (a length in the X direction). Since the insulator column HR_O is formed of, for example, an insulating material such as a silicon oxide film, even if a conductor to be wiring is provided in the slit ST, there is no concern that an unintended short circuit occurs.

Further, broken line circles HRc of FIG. 6 show the arrangement of the insulator columns HR_O that are formed in substantially circular shapes as the columnar portions HR_M. A slit area Rst shows an area where the slit ST is to be formed in a following step. In a step of forming the columnar portions HR_M and the insulator columns HR_O illustrated in FIG. 6, the slit ST is not formed yet.

When the insulating material is embedded in the holes of the insulator columns HR_O, the holes of the columnar portions HR_M are covered with the mask members CM as described below. A carbon film, for example, is used for the mask member CM.

Since the insulator columns HR_O have substantially oval shapes having the major axes in the Y direction, even if the mask members CM are partially provided on the holes of the insulator columns HR_O to block a portion of openings of the holes of the insulator columns HR_O, the insulating material can still be sufficiently filled in the holes of the insulator columns HR_O. Therefore, even if end portions Ecm of the mask members CM on the slit area Rst side are extended (or shifted) to some extent to the slit area Rst side, the insulator columns HR_O can still be sufficiently formed.

Due to extension of the end portions Ecm of the mask members CM on the slit area Rst side to the slit area Rst side, the end portions Ecm of the mask members CM are spaced far from the holes of the columnar portions HR_M to the slit area Rst side, and thus the mask members CM can sufficiently cover the holes of the columnar portions HR_M. Accordingly, in a step of forming the insulator columns HR_O described below, when a stacked body 2a is processed with a solution by wet etching or the like, penetration of the solution between the mask members CM and an interlayer insulating film to reach the holes of the columnar portions HR_M can be prevented. Accordingly, unintended etching of the material (e.g., the block insulating film 21a) in the holes of the columnar portions HR_M can be prevented.

If the block insulating film 21a is etched in the holes of the columnar portions HR_M, when the columnar portions HR_M are formed in the MANOS structure, the word lines WL are short-circuited to leak currents.

In contrast, according to the present embodiment, the mask members CM widely and sufficiently cover the holes of the columnar portions HR_M to the slit area Rst side, and thus the etching of the material (e.g., the block insulating film 21a) in the holes of the columnar portions HR_M can be prevented. Accordingly, a short circuit of the word lines WL is prevented so that the current leakage can be prevented.

In addition, since the insulator columns HR_O have substantially oval shapes having major axes in the Y direction, positions of the insulator columns HR_O can be shifted to the slit area Rst side (in Y direction).

When the insulator column HR_O has the same size as the columnar portion HR_M and a substantially circular shape as illustrated by the broken line circle HRc, if the insulator column HR_O is shifted to the slit area Rst side (in Y direction), distances Dc between the columnar portions HR_M and the insulator columns HR_O increase. Accordingly, in the replacement step of replacing the sacrificial films of the stacked body with the electrode films 21, the insulating films 22 after the sacrificial films are removed are sunk or bended.

In contrast, according to the present embodiment, since the insulator columns HR_O have substantially oval shapes having major axes in the Y direction, distances D_O between the columnar portions HR_M and the insulator columns HR_O can be narrower than the distances Dc. Accordingly, in the replacement step, after the sacrificial films are removed, the insulator columns HR_O having the substantially oval shapes can sufficiently support the insulating films 22, and the sinkage or bending of the insulating films 22 can be prevented. Accordingly, even if the positions of the insulator columns HR_O are shifted to the slit area Rst side (in Y direction), it is not likely that the insulating films 22 are sunk.

Further, the insulator columns HR_O are overlapped with the slit area Rst, and thus the slits ST to be formed in the following step are brought into contact with the insulator columns HR_O. However, the insulator columns HR_O are formed of an insulating material such as a silicon oxide film, and thus it does not matter if the insulator columns HR_O are in contact with the slits ST. Even if wiring is provided in the slits ST, the insulator columns HR_O are formed of an insulating material, and thus the wiring is not short-circuited with other elements (e.g., the memory cells).

Next, a manufacturing method of the semiconductor storage device 100a according to the present embodiment is described.

FIGS. 7 to 13 are cross-sectional views for explaining the manufacturing method of the semiconductor storage device 100a according to the first embodiment. Further, FIGS. 7 to 13 illustrate cross sections of peripheral areas of the slit area Rst of the step portion 2s. In addition, for convenience, FIGS. 7 to 13 show a step of forming one insulator column HR_O adjacent to the slit area Rst and two columnar portions HR_M adjacent thereto.

First, the base body portion 1 is formed. Next, a conductive layer P1, a sacrificial film S1, and a conductive layer P2 are stacked on the interlayer insulating film 11 of the base body portion 1 in this order. A conductive material such as doped polysilicon, for example, is used for the conductive layers P1 and P2. The insulating material such as a silicon oxide film is used for the sacrificial film S1. The sacrificial film S1 is replaced with a conductive material in a subsequent step.

Accordingly, a conductive material introduced instead of the conductive layers P1 and P2 and the sacrificial film S1 functions as one buried source layer BSL.

Next, the stacked body 2a including the insulating films 22 and sacrificial films 21s is formed on the conductive layer P2. For example, the insulating material such as a silicon oxide film is used for the insulating films 22. For example, the insulating material such as a silicon nitride film that can be selectively etched with respect to the insulating films 22 is used for the sacrificial films 21s. The sacrificial films 21s are replaced with conductive materials of the electrode films 21 in the following replacement step.

After a lower stacked body 2aL is formed, lower holes H_ML of the columnar portions HR_M and lower holes H_OL of the insulator columns HR_O are formed by using a lithography technique and an etching technique. A width of the lower hole H_OL in the Y direction becomes wider than that of the lower hole H_ML. In a plan view seen from the Z direction, the lower hole H_OL may have a substantially oval shape. In addition, in a plan view seen from the Z direction, the lower hole H_OL is closer to a formation area Rst of the slit ST than other lower holes H_ML, and though not specifically illustrated, the lower holes H_OL are located along both sides of the slit area Rst. Subsequently, sacrificial films HR_MLs and HR_OLs are formed in the lower holes H_ML and H_OL. For example, an insulating material such as a silicon oxide film is used for the sacrificial films HR_MLs and HR_OLs. In the following steps, the sacrificial films HR_MLs and HR_OLs are removed when the columnar portions HR_M and the insulator columns HR_O are formed.

Figure 7:
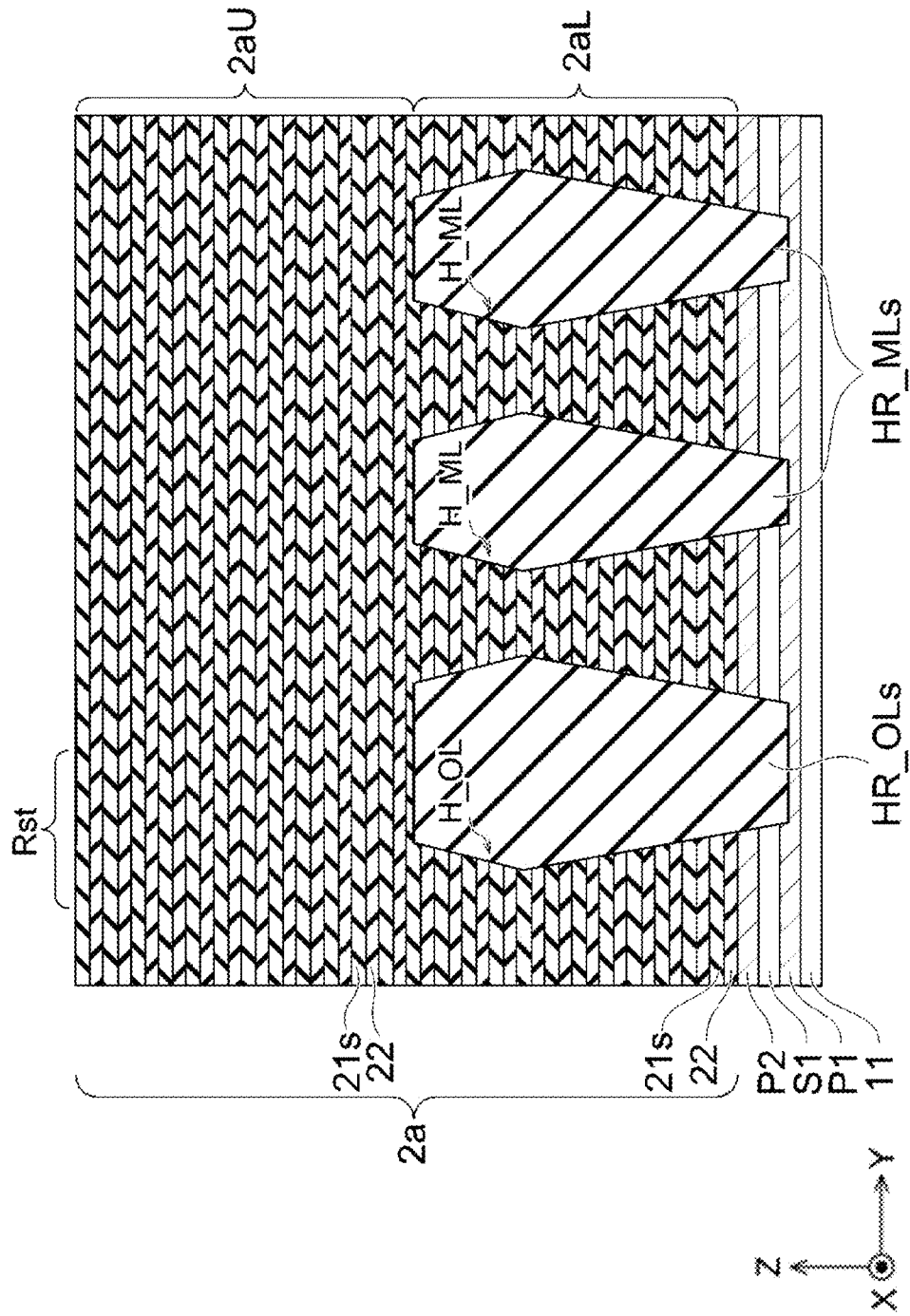
FIGS. 7 through 13 are cross-sectional views for explaining a manufacturing method of a semiconductor storage device according to a first embodiment.

Next, the insulating films 22 and the sacrificial films 21s are further stacked on the lower stacked body 2aL to form an upper stacked body 2aU. Accordingly, a structure illustrated in FIG. 7 is obtained. Further, the slit ST is not yet formed in the slit area Rst.

Figure 8:
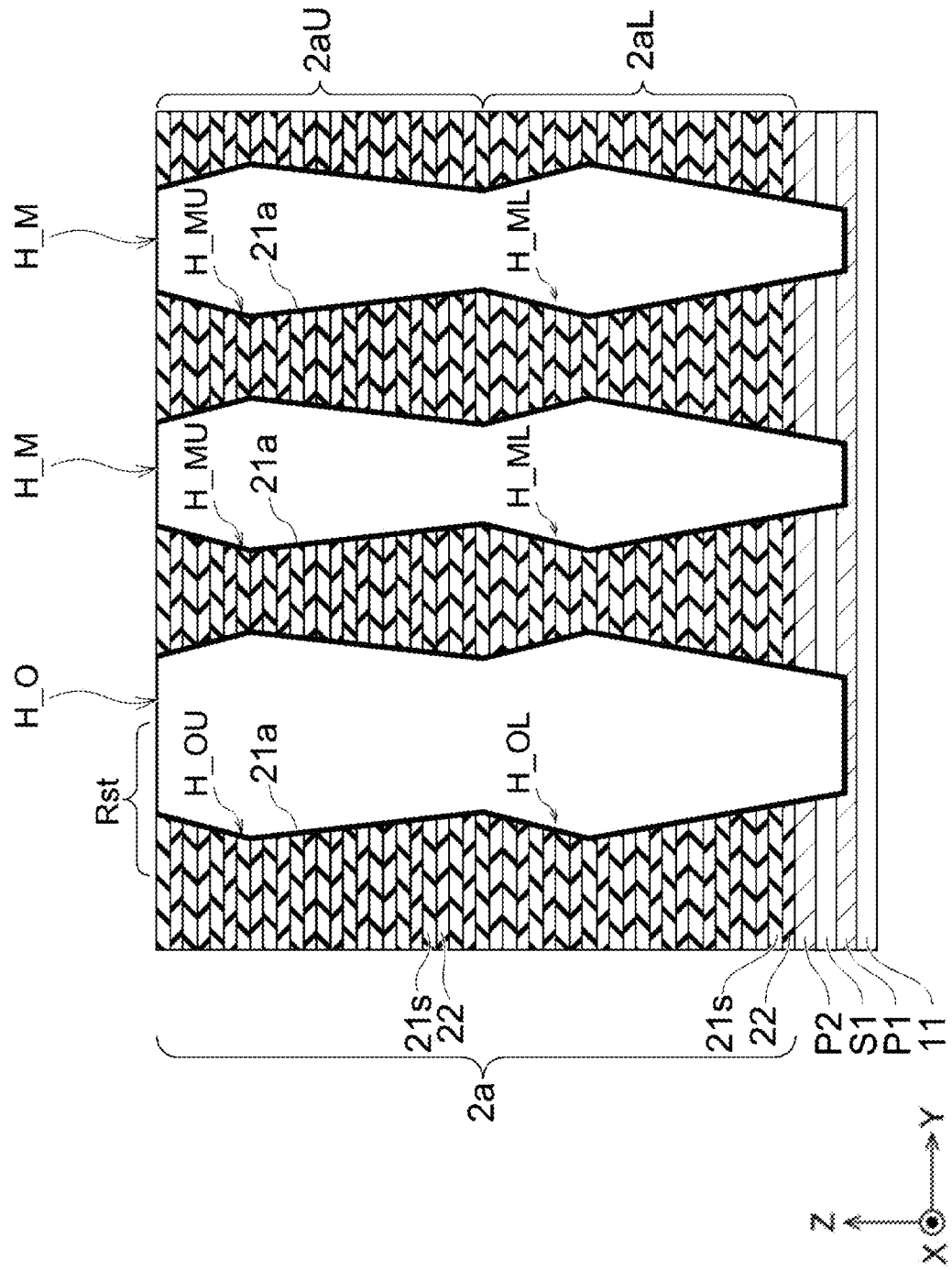

Next, as illustrated in FIG. 8, upper holes H_MU of the columnar portions HR_M and an upper hole H_OU of the insulator column HR_O are formed above the lower holes H_ML and the lower hole H_OL by using a lithography technique and an etching technique. A width of the upper hole H_OU in the Y direction becomes wider than that of the upper hole H_MU. In a plan view seen from the Z direction, the upper hole H_OU may have a substantially oval shape.

At the same time as formation of the upper holes H_MU and H_OU or after the formation thereof, the sacrificial films HR_MLs and HR_OLs in the lower holes H_ML and H_OL are removed. Accordingly, the upper hole H_OU and the lower hole H_OL communicate with each other, and the upper holes H_MU and the lower holes H_ML communicate with each other, to form holes H_M and H_O illustrated in FIG. 8. Though not specifically illustrated, the holes H_O are located along both sides of the slit area Rst, and thus are located to be closer to the slit area Rst than the holes H_M. Next, the block insulating films 21a are formed on inner walls of the holes H_M and H_O. A width of the hole H_O in the Y direction is wider than that of the hole H_M in the Y direction. In a plan view seen from the Z direction, the hole H_O has a substantially oval shape, and the hole H_M has a substantially circular shape.

Next, a mask member CM and a hard mask HM are formed on the stacked body 2a. The mask member CM is formed of a poorly covering material and formed by a poorly covering deposition method so that the mask member CM does not fill into the holes H_M and H_O. For example, a carbon film is used for the mask member CM and is deposited by a plasma chemical vapor deposition (CVD) method.

Figure 9:
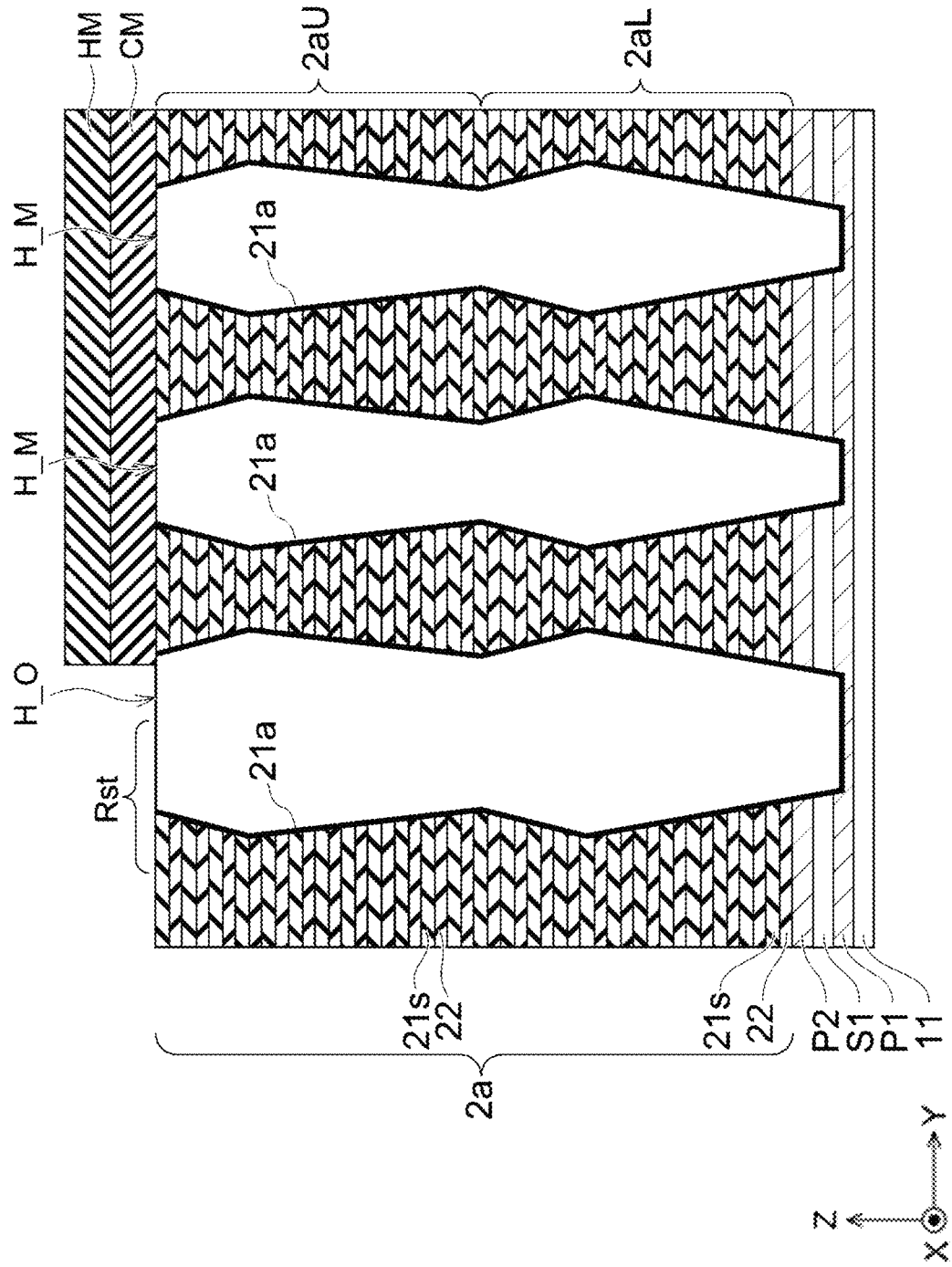

Next, by using a lithography technique and an etching technique, the hard mask HM is processed, and the mask member CM can be later processed by using the hard mask HM as a mask. Accordingly, as illustrated in FIG. 9, the hard mask HM and the mask member CM are removed from above the holes H_O near (e.g., on both sides of) the slit area Rst. The hard mask HM and the mask member CM still cover the holes H_M but not the holes H_O or the memory holes in a formation area of the memory cell array 2m.

Figure 10:
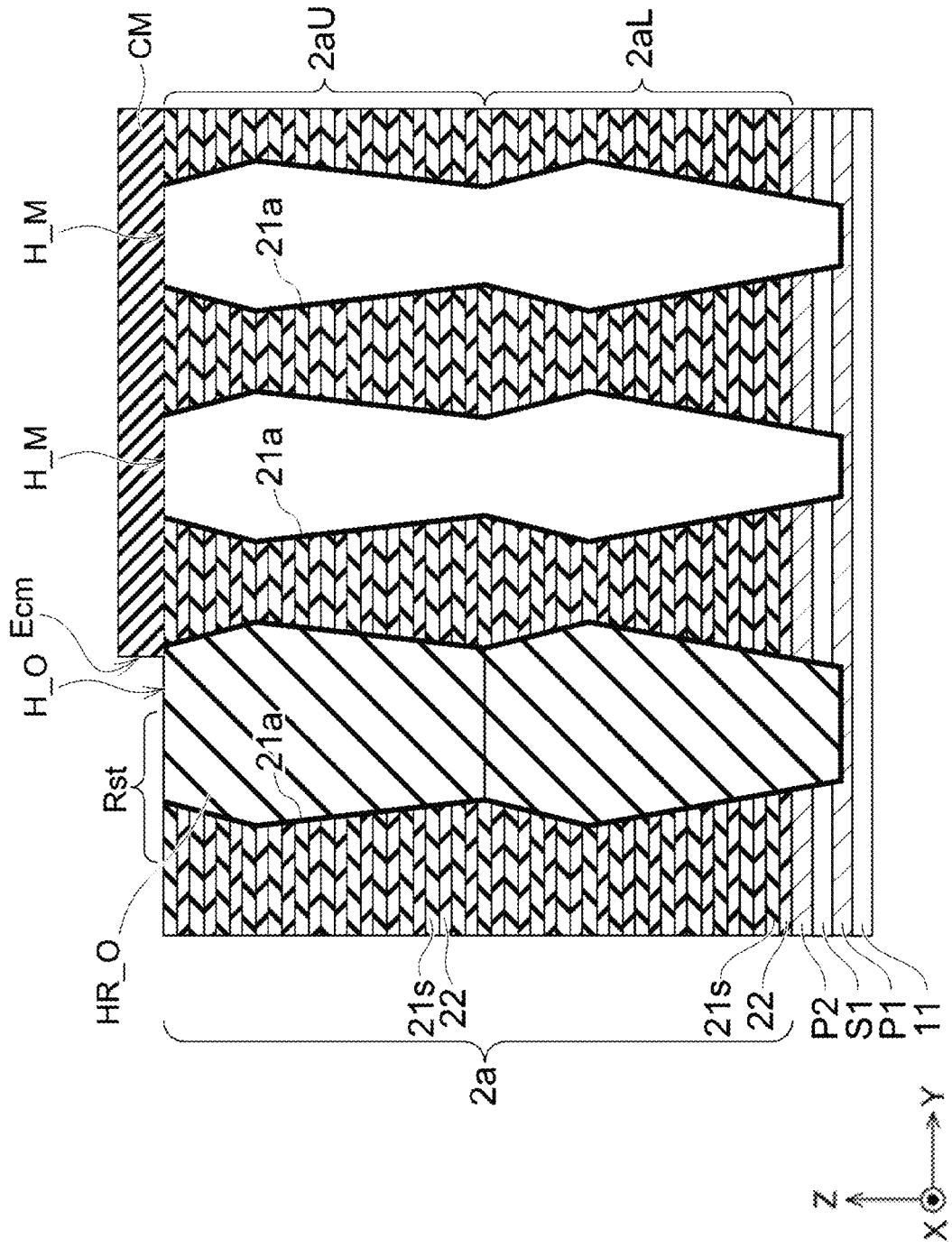

After the hard mask HM is removed, an insulating material is selectively embedded into the hole H_O as illustrated in FIG. 10. For example, a silicon oxide film is used for the insulating material. Accordingly, the insulator columns HR_O are formed. At this time, the hole H_O is wider than the hole H_M in the Y direction, and thus the insulating material can still be sufficiently embedded in the hole H_O even if the mask member CM partially blocks some portion of the opening of the hole H_O. Therefore, the mask member CM can be further extended to the slit area Rst side. The end portion Ecm of the mask member CM can be located at the position widely spaced from the hole H_M to the slit area Rst side. Accordingly, a width of the mask member CM from the hole H_M to the slit area Rst side (a length from an end portion of the hole H_M to the end portion Ecm of the mask member CM) can be increased.

Furthermore, since insulating material is embedded in the insulator column HR_O, the insulator column HR_O may be in contact with or overlapped with the slit ST without adverse effect. Accordingly, the position of the insulator column HR_O may be further shifted to the slit area Rst side. Accordingly, the width of the mask member CM from the hole H_M to the slit area Rst side (the length from the end portion of the holes H_M to the end portion Ecm of the mask member CM) can be further increased.

Figure 11:
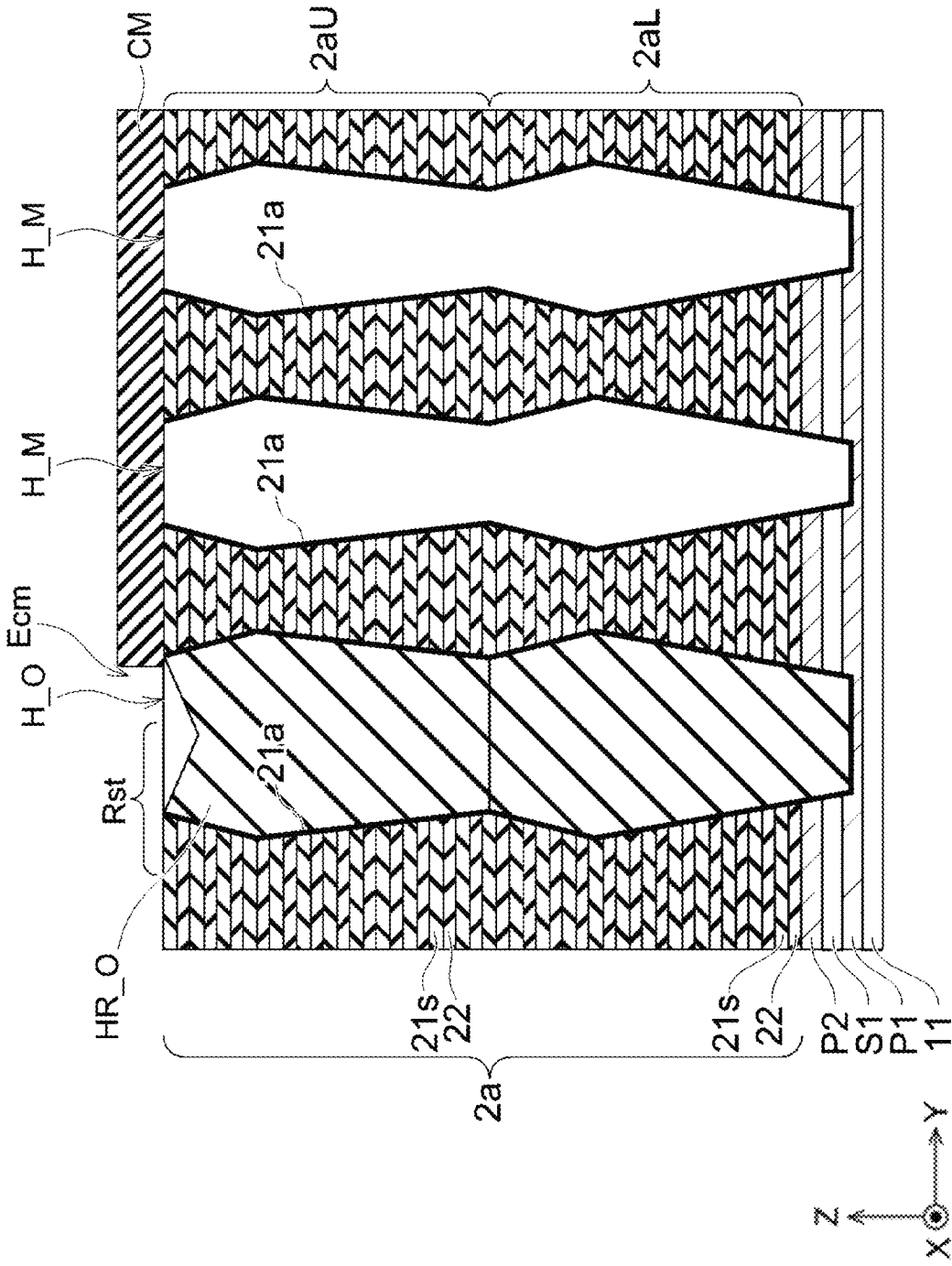

Next, as illustrated in FIG. 11, excess oxide film on the stacked body 2a is removed by a wet etching process. At this time, the holes H_M are still covered with the mask member CM such as a carbon film, but as described above, the width of the mask member CM from the hole H_M to the slit area Rst side can be increased. Accordingly, the etching solution is better prevented from passing through the interface between the mask member CM and the stacked body 2a and reaching the hole H_M.

If the etching solution reaches the holes H_M, there is a concern that the etching solution will remove an upper portion of the block insulating film 21a on an inner wall of the hole H_M. Such a removal may lead to a short circuit between the word lines WL formed later to cause current leakage.

In contrast, according to the present embodiment, the width of the mask member CM from the hole H_M to the slit area Rst side can be increased (extended). Accordingly, even if the hole H_M is covered with a poorly covering carbon film or the like, the etching solution can still be prevented from reaching into the hole H_M, so that the short circuit between the word lines WL and the current leakage can be prevented.

Figure 12:
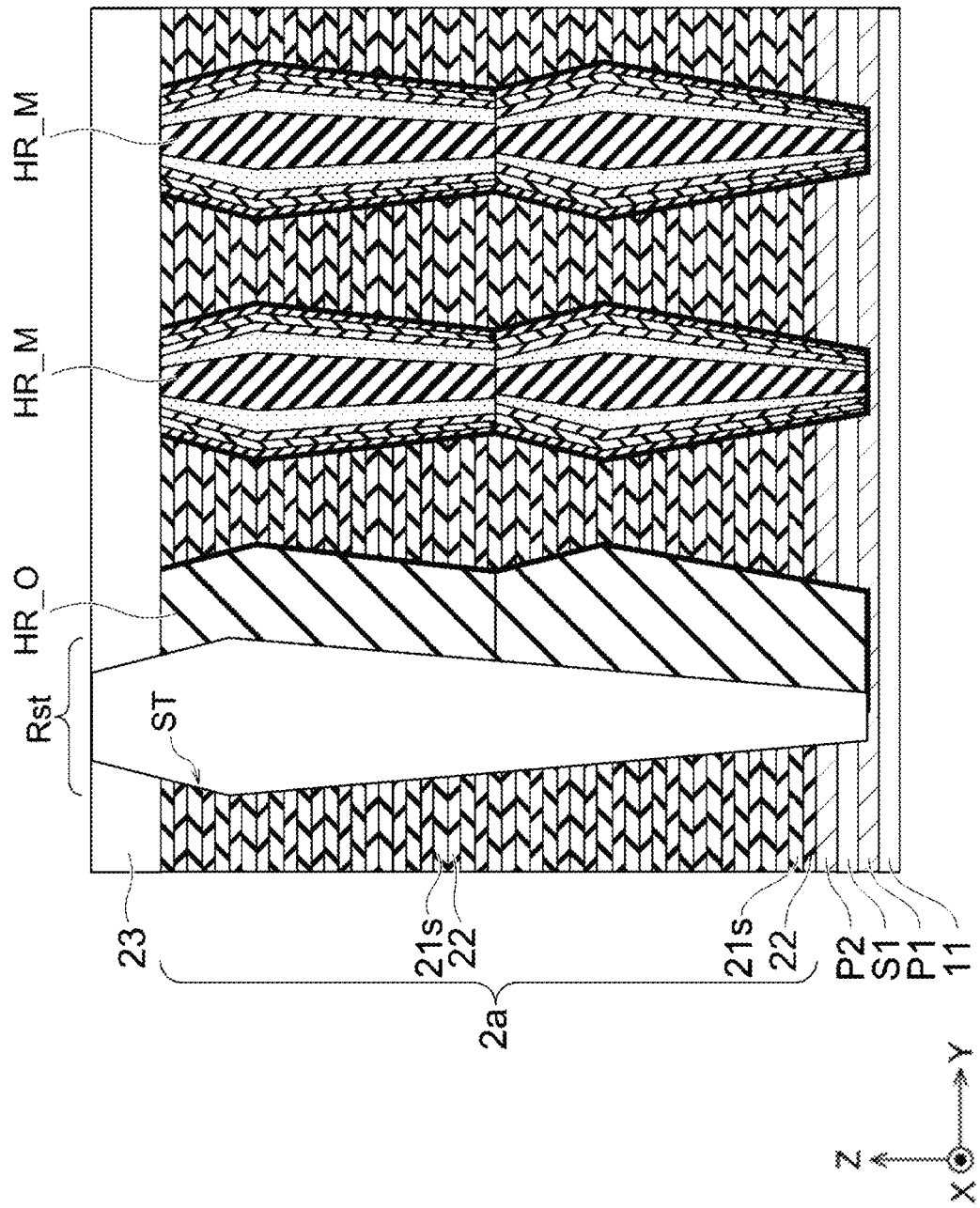

Next, the mask member CM is removed to permit the formation of a MANOS structure or a MONOS structure in the hole H_M (which is more spaced from the slit area Rst than is the hole H_O). Accordingly, as illustrated in FIG. 12, the columnar portions HR_M are formed in the holes H_M. The columnar portions HR_M can be formed simultaneously with the columnar portions CL of the memory holes in other areas of the device.

Next, an interlayer insulating film 23 is formed on the stacked body 2a. For example, an insulating material such as a silicon oxide film is used for the interlayer insulating film 23.

Next, the slit ST is formed in the slit area Rst by using a lithography technique and an etching technique. The slit ST penetrates the stacked body 2a and reaches the conductive layers P1 and P2. The slit ST may be overlapped with a portion of the insulator column HR_O. Accordingly, a structure illustrated in FIG. 12 is obtained.

Figure 13:
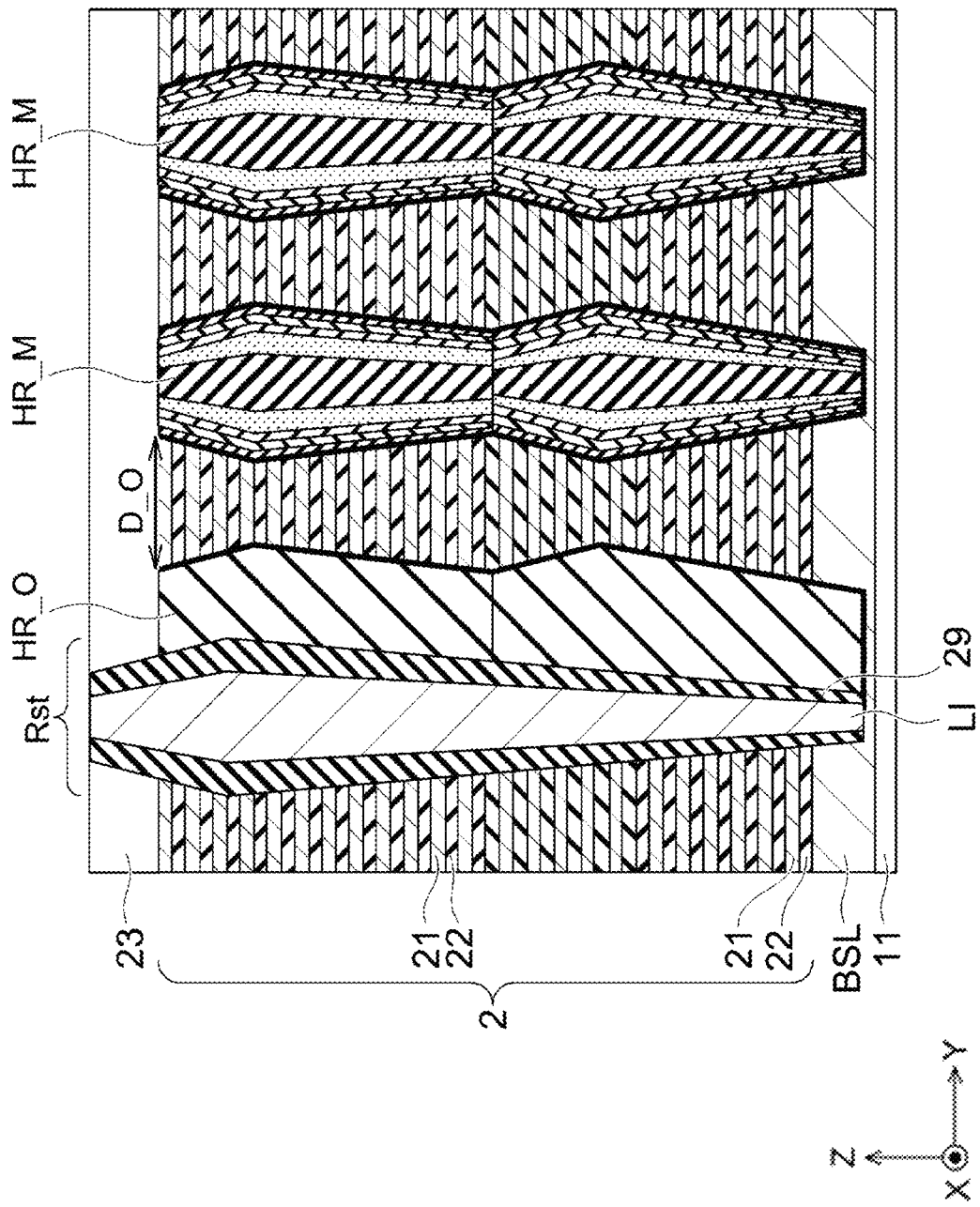

Next, as illustrated in FIG. 13, the sacrificial film S1 is replaced with a conductive material such as doped polysilicon or a metal material, and formed as the buried source layer BSL together with the conductive layers P1 and P2. In addition, the sacrificial films 21s are replaced, for example, with a low resistance metal material such as tungsten, to form the electrode films 21 in the replacement step. Accordingly, the stacked body 2a becomes the stacked body 2 including the electrode films 21 and the insulating films 22. The electrode films 21 function as the word lines WL in the memory cell array 2m. In this replacement step, since the insulator column HR_O has a substantially oval shape having a major axis in the Y direction, even if the position of the insulator column HR_O is shifted to the slit ST side, the distance D_O between the insulator column HR_O and the columnar portion HR_M is rarely widened. Accordingly, the sinkage of the stacked body 2a between the insulator column HR_O and the columnar portion HR_M in the replacement step can be prevented.

Next, an insulating film 29 is formed on the inner wall of the slit ST, and a conductive material of wiring LI is buried in the slit ST in the insulating film 29. For example, an insulating material such as a silicon oxide film is used for the insulating film 29. For example, a low resistance metal material such as tungsten is used for the wiring LI. Accordingly, the wiring LI is electrically isolated from the electrode film 21 by the insulating film 29, penetrates the stacked body 2, and functions as wiring electrically connected to the buried source layer BSL. The insulating material is buried in the insulator column HR_O, and thus the slit ST may be overlapped with or in contact with the insulator column HR_O.

Thereafter, a multilayer wiring layer, a bit line, and the like are formed on the interlayer insulating film 23, to complete the semiconductor storage device 100a according to the present embodiment. The semiconductor storage device 100a may be formed by bonding a CMOS circuit (the base body portion 1) and a memory cell array 2m (the stacked body 2) that are formed on different substrates.

As described above, according to the present embodiment, the insulator column HR_O is formed in a substantially oval shape, and the width of the hole H_O in the Y direction is widened, so that the position of the insulator column HR_O can be shifted to the slit area Rst side, while a supporting function of the stacked body 2a in the replacement step is maintained. Accordingly, the end portion Ecm of the mask member CM on the slit area Rst side can be extended to the slit area Rst side. Therefore, the mask member CM can sufficiently cover the hole H_M of the columnar portion HR_M, so that it is possible to prevent the etching solution from penetrating between the mask member CM and the interlayer insulating film in the formation step of the insulator column HR_O, to reach the hole of the columnar portion HR_M. As a result, it is possible to prevent the material (e.g., the block insulating film 21a) in the hole of the columnar portion HR_M from being etched, and thus the current leakage in the word line WL can be prevented.

In addition, in the step portion 2s, the columnar portions HR_M other than the insulator columns HR_O on both sides of the slit ST have the same configurations (e.g., MANOS or MONOS) as the columnar portion CL of the memory cell array 2m. Accordingly, the sinkage of the stacked body 2 due to the difference in the thermal expansion coefficients (or heat shrinkage rates) can be prevented.

Further, as long as the sinkage of the stacked body 2 does not cause a problem in manufacturing, the insulator columns HR_O may be formed in just one row on either one of the sides of the slit ST, but in some examples, n rows (wherein n is an integer of 2 or more) may be provided on either or both sides of the slit ST. In addition, the columnar portion HR_M may have a different structure from the columnar portion CL, as long as the thermal expansion coefficient or the heat shrinkage rate are the same or substantially so. For example, the columnar portion HR_M may be a conductor column formed of a metal material such as tungsten in some examples.

Modification

In a lithography technique for forming the mask member CM and the hard mask HM as in FIG. 9, alignment of a photomask or the like with respect to already formed hole H_O may be generally difficult.

Therefore, in the present modification, a hole H_A to serve as an alignment mark is formed in the end portion of the slit area Rst of the step portion 2s.

Figure 14:
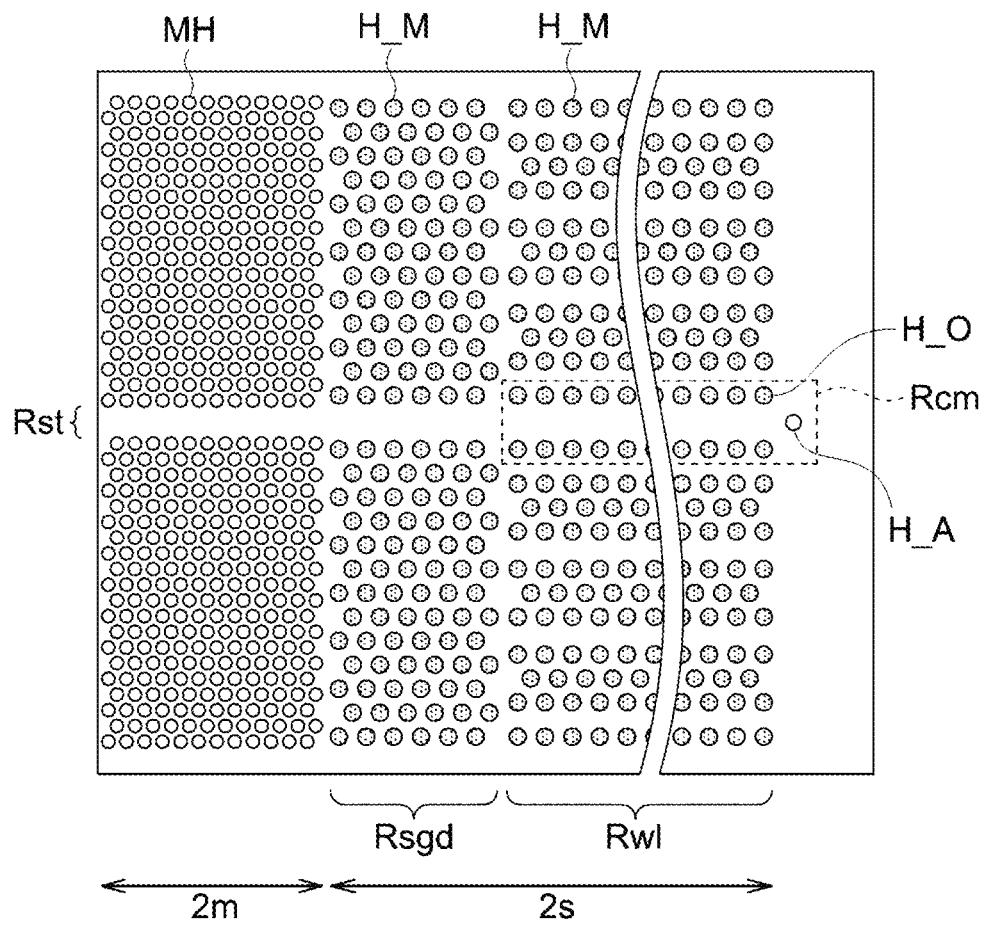
FIGS. 14 through 16 are plan views for explaining a lithography step according to a modification.
Figure 15:
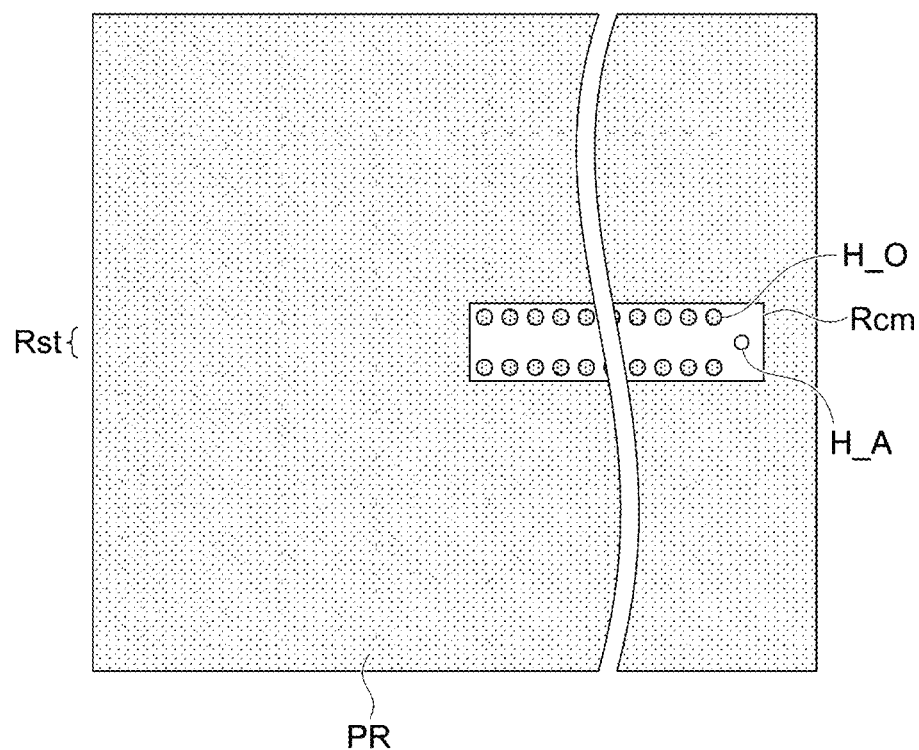
Figure 16:
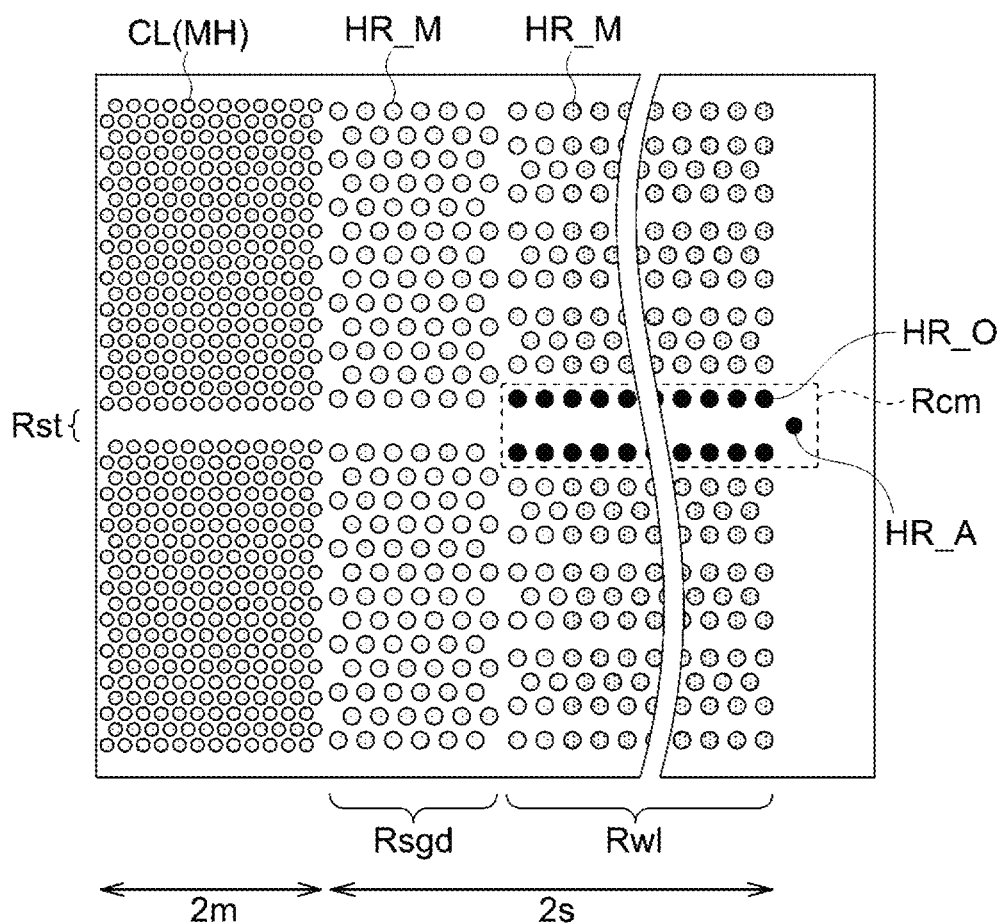
Figure 16:
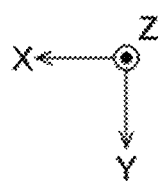

FIGS. 14 to 16 are plan views for explaining an example of a lithography step such as in FIG. 9 according to the present modification. FIG. 14 illustrates memory holes MH formed in the area of a memory cell array 2m and holes H_M and H_O provided in a step portion 2s. At this stage, the mask member CM and the hard mask HM are not yet formed.

The select gate area Rsgd is a step area (also called a terrace area) for forming contact plugs connected to a drain-side select gate SGD. The word line area Rwl is a step area (also called a terrace area) for forming contact plugs connected to word lines WL. These contact plugs correspond to CC of FIG. 5.

An opening area Rcm designates an opening area in the mask member CM to be formed in the following step. The opening area Rcm exposes a hole H_A for an alignment mark as well as the holes H_O for insulator columns HR_O. That is, the opening area Rcm exposes the slit area Rst and the holes H_O and H_A that are adjacent to each other on both sides of the slit area Rst in the step portion 2s.

The hole H_A can be simultaneously formed in the same step as the holes H_O. Therefore, the hole H_A may have the same configuration as the hole H_O. However, since the hole H_A is primarily intended to function as an alignment mark, the hole H_A may have a shape that is the same as or different from that of the hole H_O in a plan view seen from the Z direction. In a plan view seen from the Z direction, the hole H_A may have, for example, a substantially oval shape or may have a substantially circular shape or substantially polygonal shape. In the following steps, insulating materials are embedded in the hole H_A, in the same steps as the hole H_O. Accordingly, an insulator column HR_A having the same configuration as the insulator column HR_O is formed.

Next, as described with reference to FIG. 9, materials of the mask member CM and the hard mask HM are deposited on the memory cell array 2m and the step portion 2s.

Next, as illustrated in FIG. 15, a resist film PR (in which the opening area Rcm is formed) is formed on the hard mask HM by a lithography technique. At this time, the positioning of the opening area Rcm of the resist film PR can be inspected to check for misalignment of the resist film PR.

At this stage, the holes H_M and H_O can be somewhat different in the planar shapes, but still have substantially the same size, and are regularly arranged with one another. Therefore, it might, in general, be difficult to see the misalignment of the resist film PR since it may be difficult to distinguish the holes H_M from the holes H_O (and vice versa) in an optical type inspection process.

Therefore, according to the present modification, the hole H_A is provided as an alignment mark in the end portion of the slit area Rst of the step portion 2s. The hole H_A is arranged outside the word line area Rwl of the step portion 2s, and is positioned away from the other holes (holes H_O and H_M) in the X direction. The hole H_A can be provided outside the slit area Rst in an extension direction of the slit area Rst. Accordingly, the hole H_A can be easily distinguished from the other holes H_O and H_M. Since the position of the hole H_A can be identified, whether the position of the opening area Rcm is the correct position can be more easily verified. As a result, the misalignment of the resist film PR can be easily found.

Furthermore, as in the present modification, one hole H_A (e.g., the insulator column HR_A) may be provided in each slit area Rst. However, in other examples, a plurality of holes H_A (e.g., the insulator columns HR_A) may be provided in each slit area Rst.

Next, as described with reference to FIGS. 10 to 12, the hard mask HM is processed by using the resist film PR as a mask, and the mask member CM is processed by using the hard mask HM as a mask. Next, insulating materials are selectively embedded in the holes H_O and H_A by using the mask members CM as a mask. Accordingly, the insulator column HR_A is formed at the position of the hole H_A. When being viewed from the Z direction, the insulator column HR_A is provided outside the end portion of the slit ST (the insulating film 29 and the wiring LI) in the extension direction of the slit ST (X direction).

After the mask member CM is removed, the columnar portions CL are formed in the holes H_M and the memory holes MH. Accordingly, a structure illustrated in FIG. 16 can be obtained.

Next, the slit ST is formed in the slit area Rst as illustrated in FIG. 12, and the insulating film 29 and the wiring LI are formed in the slit ST as illustrated in FIG. 13. Thereafter, in the same manner as in the first embodiment, a multilayer wiring layer, a bit line, and the like are formed, to complete the semiconductor storage device 100a according to the present modification.

In this manner, the hole H_A for the alignment mark is provided in the end portion of the slit area Rst of the step portion 2s according to the present modification. Since the position of the hole H_A can be easily identified, whether the position of the opening area Rcm is the correct position can be easily verified. As a result, the misalignment of the resist film PR can be easily found.

In addition, according to the present modification, by using the hole H_A at the end portion of the slit area Rst as a reference, the end portion of the step portion 2s can be easily inspected.

In addition, the hole H_A is formed in the same step as the hole H_O, and the insulator column HR_A is formed in the same step as the insulator column HR_O. Therefore, there is no cost increase due to the addition of the hole H_A.

The rest of the configurations and the manufacturing method according to the present modification are the same as those according to the first embodiment. Therefore, the present modification can obtain the same effect as the first embodiment.

Figure 17:
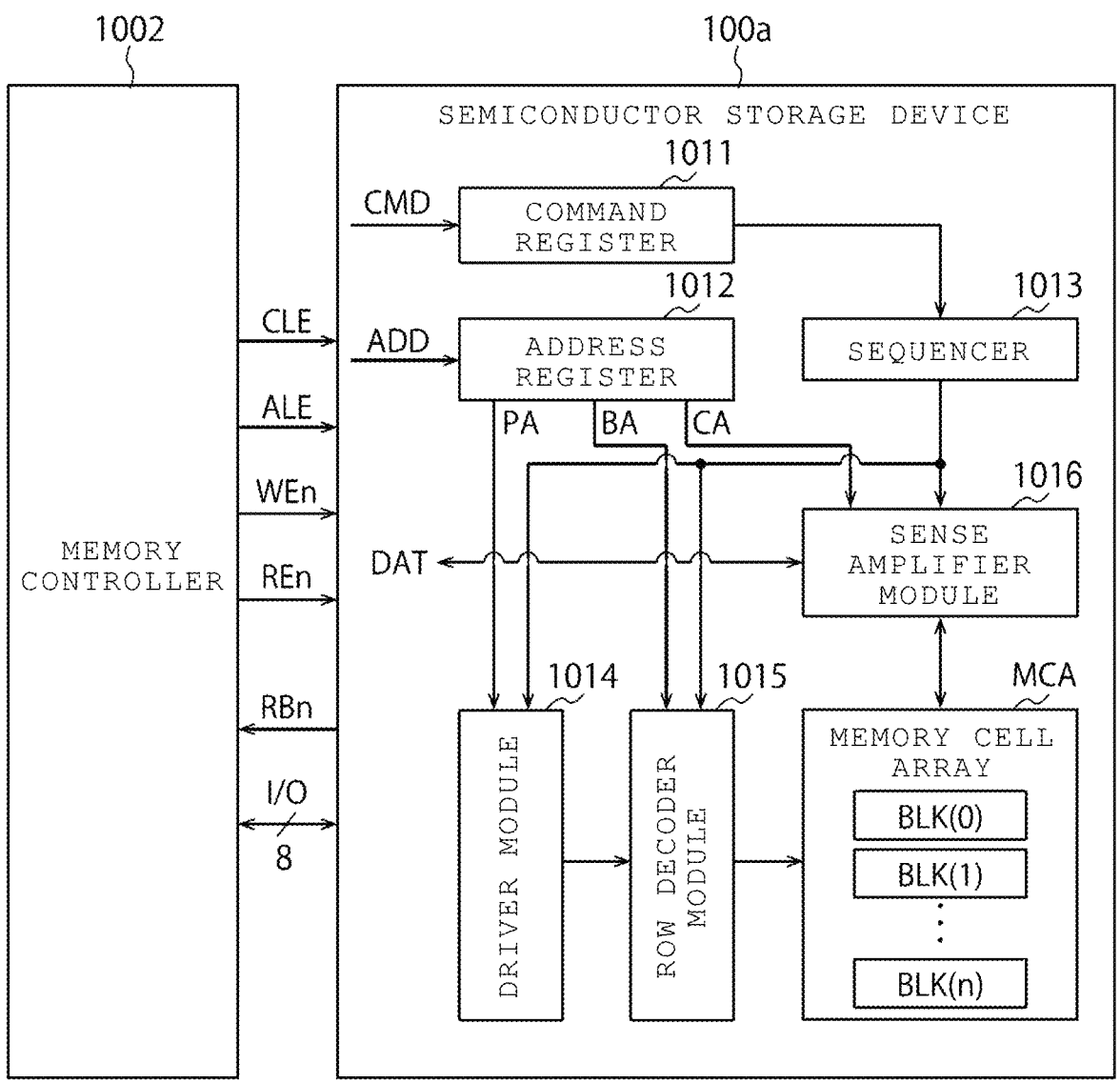
FIG. 17 is a hardware block diagram of a semiconductor storage device according to one embodiment.

FIG. 17 is a hardware block diagram of the semiconductor storage device 100a according to any one of the above-described embodiments or modifications. The semiconductor storage device 100a is a NAND-type flash memory that can store data in a nonvolatile manner and is controlled by an external memory controller 1002. The communication between the semiconductor storage device 100a and the memory controller 1002 supports, for example, a NAND interface standard.

As illustrated in FIG. 17, the semiconductor storage device 100a includes, for example, a memory cell array MCA, a command register 1011, an address register 1012, a sequencer 1013, a driver module 1014, a row decoder module 1015, and a sense amplifier module 1016.

The memory cell array MCA includes a plurality of blocks BLK(0) to BLK(n) (n is an integer of 1 or more). The block BLK is a set including a plurality of memory cells that can store data in a nonvolatile manner, and is used, for example, as an erasing unit of data. In addition, a plurality of bit lines and a plurality of word lines are provided in the memory cell array MCA. For example, each memory cell is associated with one bit line and one word line. Detailed configurations of the memory cell array MCA are described below.

The command register 1011 stores a command CMD that the semiconductor storage device 100a receives from the memory controller 1002. The command CMD includes an instruction, for example, for causing the sequencer 1013 to perform a read operation, a write operation, an erasing operation, or the like.

The address register 1012 stores address information ADD that the semiconductor storage device 100a receives from the memory controller 1002. The address information ADD includes, for example, a block address BA, a page address PA, and a column address CA. For example, the block address BA, the page address PA, and the column address CA are used for selecting the block BLK, the word line, and the bit line, respectively.

The sequencer 1013 is a control circuit that controls the entire operations of the semiconductor storage device 100a. For example, the sequencer 1013 controls the driver module 1014, the row decoder module 1015, the sense amplifier module 1016, and the like based on the command CMD stored in the command register 1011 and performs the read operation, the write operation, the erasing operation, and the like.

The driver module 1014 generates a voltage to be used for the read operation, the write operation, the erasing operation, and the like. Also, the driver module 1014 applies the generated voltage to a signal line corresponding to the selected word line, for example, based on the page address PA stored in the address register 1012.

The row decoder module 1015 includes a plurality of row decoders. The row decoder selects one block BLK in the corresponding memory cell array MCA based on the block address BA stored in the address register 1012. Also, the row decoder transmits, for example, the voltage applied to the signal line corresponding to the selected word line to the selected word line in the selected block BLK.

The sense amplifier module 1016 applies a desired voltage to each bit line according to write data DAT received from the memory controller 1002 in the write operation. In addition, in the read operation, the sense amplifier module 1016 determines data stored in the memory cell based on the voltage of the bit line and transmits a determination result to the memory controller 1002 as read data DAT.

The semiconductor storage device 100a and the memory controller 1002 described above may make up one semiconductor device in combination. Examples of such a semiconductor device include a memory card such as an SD™ card, and a solid state drive (SSD).

Figure 18:
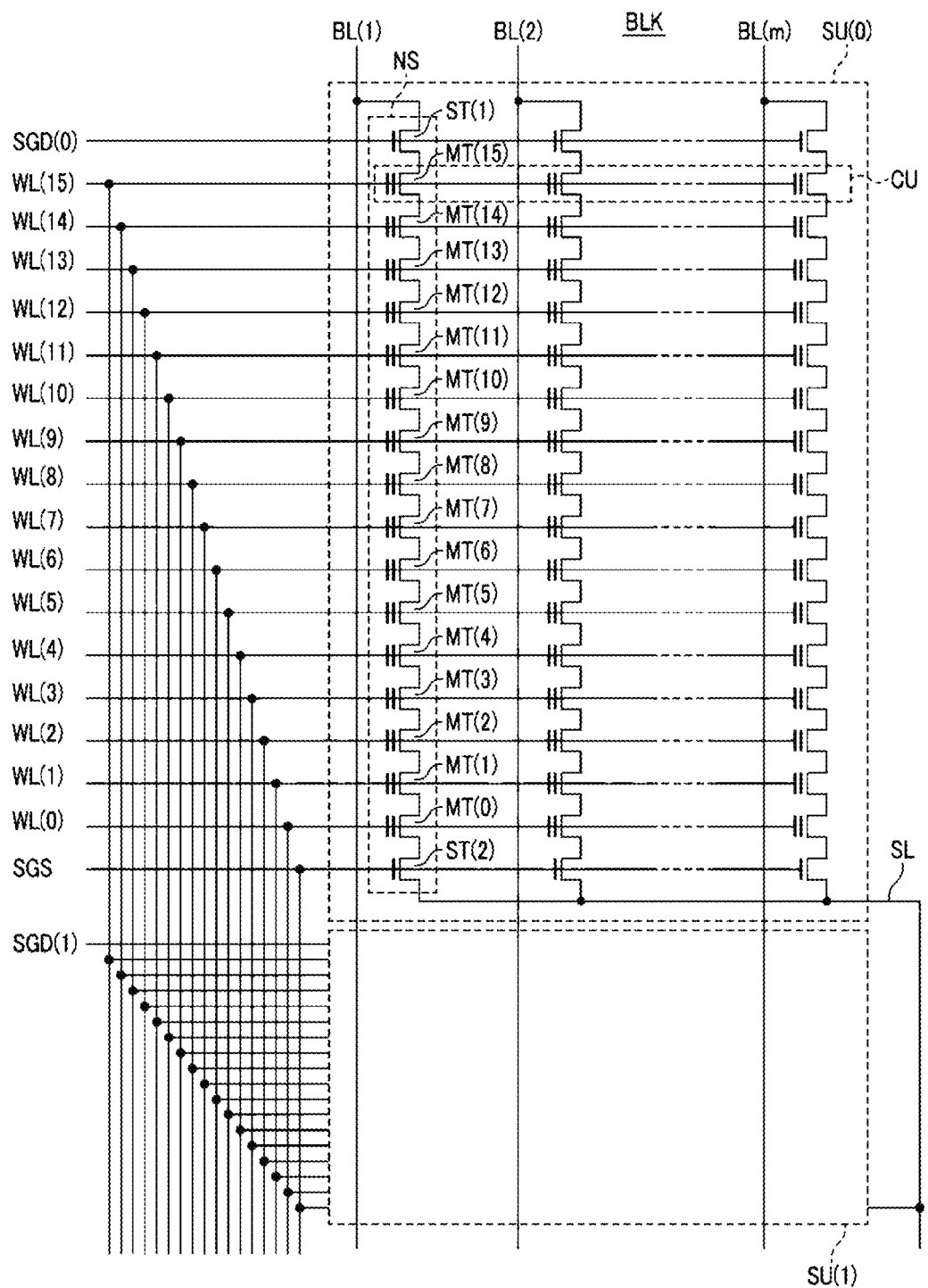
FIG. 18 is a circuit diagram of a memory cell array.

FIG. 18 is a circuit diagram of the memory cell array MCA. One block BLK among the plurality of blocks BLK in the memory cell array MCA is extracted. As illustrated in FIG. 18, the block BLK includes a plurality of string units SU(0) to SU(k) (k is an integer of 1 or more).

Each string unit SU includes a plurality of NAND strings NS associated with the bit lines BL(0) to BL(m) (m is an integer of 1 or more). Each NAND string NS includes, for example, memory cell transistors MT(0) to MT(15) and select transistors ST(1) and ST(2). The memory cell transistor MT includes a control gate and a charge storage layer, and stores data in a nonvolatile manner. The select transistors ST(1) and ST(2) each are used for selecting the string units SU during various operations.

In each NAND string NS, the memory cell transistors MT(0) to MT(15) are connected to each other in series. A drain of the select transistor ST(1) is connected to the associated bit line BL, and a source of the select transistor ST(1) is connected to one end of the memory cell transistors MT(0) to MT(15) connected to each other in series. A drain of the select transistor ST(2) is connected to the other end of the memory cell transistors MT(0) to MT(15) connected to each other in series. A source of the select transistor ST(2) is connected to a source line SL.

In the same block BLK, the control gates of the memory cell transistors MT(0) to MT(15) are commonly connected to the word lines WL(0) to WL(7), respectively. The gates of the select transistors ST(1) in the string units SU(0) to SU(k) are commonly connected to select gate lines SGD(0) to SGD(k), respectively. The gates of the select transistors ST(2) are commonly connected to the select gate line SGS.

In the circuit configuration of the memory cell array MCA described above, the bit lines BL are shared by the NAND strings NS to which the same column address is allocated in each string unit SU. The source line SL is shared, for example, by the plurality of blocks BLK.

A set of the memory cell transistors MT connected to the common word line WL in one string unit SU is referred to as, for example, a cell unit CU. For example, a storage capacity of the cell unit CU including the memory cell transistors MT each that store 1 bit data is defined as "one page data". The cell unit CU can have a storage capacity of two page data or more according to the number of bits of data that the memory cell transistors MT each store.

Further, the memory cell array MCA that the semiconductor storage device 100a includes is not limited to the circuit configuration described above. For example, the number of the memory cell transistors MT and the select transistors ST(1) and ST(2) that each NAND string NS includes can be any number. The number of the string units SU that each block BLK includes can be any number.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a stacked body including a plurality of conductive layers that are stacked and spaced from each other in a first direction, the stacked body further having first and second areas arranged along a second direction intersecting the first direction;
   an insulating portion extending along the first and second directions in the first and second areas and dividing the conductive layers in a third direction intersecting the first and second directions;
   a plurality of first columnar portions each extending along the first direction in the first area and including a first semiconductor layer, wherein a plurality of memory cells are formed at intersections between the conductive layers and the first semiconductor layer;
   a plurality of second columnar portions each extending along the first direction in the second area and including an insulator;
   a plurality of third columnar portions each extending along the first direction in the second area and including a second semiconductor layer; and
   a plurality of contacts each extending along the first direction in the second area and electrically connected to one of the conductive layers, wherein
   the second columnar portions are on both sides of the insulating portion in the third direction.

2. The semiconductor device according to claim 1, wherein the second columnar portions are closer to the insulating portion than are the third columnar portions.

3. The semiconductor device according to claim 1, wherein the second columnar portions are arranged in a line.

4. The semiconductor device according to claim 3, wherein the third columnar portions are located farther from the insulating portion than are the second columnar portions.

5. The semiconductor device according to claim 1, wherein the first columnar portions include therein a first insulating film, a first charge storage film, a second insulating film, and a first semiconductor layer.

6. The semiconductor device according to claim 1, wherein the third columnar portions include therein a third insulating film, a second charge storage film, a fourth insulating film, and a second semiconductor layer.

7. The semiconductor device according to claim 1, wherein each of the third columnar portions has the same configuration as the first columnar portion.

8. The semiconductor device according to claim 1, wherein the second columnar portions have a substantially oval shape having a major axis in the third direction.

9. The semiconductor device according to claim 1, further comprising:
   a fourth columnar portion extending along the first direction in the second area and adjacent to an end portion of the insulating portion in the second direction.

10. The semiconductor device according to claim 1, wherein the second columnar portions have a larger diameter than the first columnar portions.

11. The semiconductor device according to claim 1, wherein the third columnar portions have a larger diameter than the first columnar portions.

12. The semiconductor device according to claim 1, wherein
the first columnar portions are separated from each other by a first interval, and
the second columnar portions are separated from each other by a second interval that is greater than the first interval.

13. The semiconductor device according to claim 1, wherein
the first columnar portions are separated from each other by a first interval, and
the third columnar portions are separated from each other by a third interval that is greater than the first interval.

14. The semiconductor device according to claim 1, further comprising:
a plurality of conductive lines above the stacked body in the first direction, extending along the third direction, and electrically connected to the conductive layers.

15. The semiconductor device according to claim 1, further comprising:
a substrate below the stacked body in the first direction and on which a transistor for controlling the memory cells is disposed.

16. A manufacturing method of a semiconductor device, comprising:
alternately stacking a plurality of first insulating films and a plurality of first sacrificial films along a first direction to form a stacked body;
forming a plurality of memory holes in a first area of the stacked body and first and second holes in a second area of the stacked body to penetrate the stacked body along the first direction, wherein
the first and second areas are arranged along a second direction intersecting the first direction,
the first holes are located along both sides of a formation area in which an insulating portion is to be formed in the second area, and
the second holes are located farther from the formation area than the first holes;
embedding insulating materials in the first holes to form a plurality of second columnar portions;
forming first semiconductor layers in the memory holes to form a plurality of first columnar portions;
forming second semiconductor layers in the second holes to form a plurality of third columnar portions; and
replacing the first sacrificial films with a plurality of conductive layers.

17. The manufacturing method according to claim 16, further comprising:
before embedding the insulating materials in the first holes, forming a mask member along a top surface of the stacked body, and then forming a hard mask on the mask member.

18. The manufacturing method according to claim 17, further comprising:
partially removing the mask member and the hard mask so that the first holes are exposed therefrom.

19. The manufacturing method according to claim 18, further comprising:
removing the remaining hard mask, wherein
the insulating materials are embedded in the first holes after the remaining hard mask is removed.

20. The manufacturing method according to claim 19, further comprising:
removing the remaining mask members after the insulating materials are embedded in the first holes; and
forming an insulating film along the top surface of the stacked body.

* * * * *